(12) United States Patent
Liu et al.

(10) Patent No.: US 8,543,947 B2
(45) Date of Patent: Sep. 24, 2013

(54) SELECTION OF OPTIMUM PATTERNS IN A DESIGN LAYOUT BASED ON DIFFRACTION SIGNATURE ANALYSIS

(75) Inventors: Hua-Yu Liu, Palo Alto, CA (US); Luoqi Chen, San Jose, CA (US); Hong Chen, San Jose, CA (US); Zhi-Pan Li, Los Gatos, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 12/914,954

(22) Filed: Oct. 28, 2010

(65) Prior Publication Data

US 2011/0107280 A1    May 5, 2011

Related U.S. Application Data

(60) Provisional application No. 61/255,738, filed on Oct. 28, 2009, provisional application No. 61/360,404, filed on Jun. 30, 2010.

(51) Int. Cl.
*G06F 17/50* (2006.01)
(52) U.S. Cl.
USPC .............................................. 716/55; 716/53
(58) Field of Classification Search
USPC ....................................................... 716/50–55
See application file for complete search history.

(56) References Cited

U.S. PATENT DOCUMENTS

| | | | |
|---|---|---|---|
| 5,229,872 A | 7/1993 | Mumola | |
| 5,296,891 A | 3/1994 | Vogt et al. | |
| 5,523,193 A | 6/1996 | Nelson | |
| 5,663,893 A | 9/1997 | Wampler et al. | |
| 5,821,014 A | 10/1998 | Chen et al. | |

(Continued)

FOREIGN PATENT DOCUMENTS

| | | |
|---|---|---|
| JP | 2002-261004 | 9/2002 |
| JP | 2003-178966 | 6/2003 |

(Continued)

OTHER PUBLICATIONS

Chris Spence, "Full-Chip Lithography Simulation and Design Analysis—How OPC is changing IC Design," Proc. SPIE, vol. 5751, pp 1-14 (2005).

(Continued)

*Primary Examiner* — Thuan Do
*Assistant Examiner* — Mohammed Alam
(74) *Attorney, Agent, or Firm* — Pillsbury Winthrop Shaw Pittman LLP

(57) ABSTRACT

The present invention relates generally to selecting optimum patterns based on diffraction signature analysis, and more particularly to, using the optimum patterns for mask-optimization for lithographic imaging. A respective diffraction map is generated for each of a plurality of target patterns from an initial larger set of target patterns from the design layout. Diffraction signatures are identified from the various diffraction maps. The plurality of target patterns is grouped into various diffraction-signature groups, the target patterns in a specific diffraction-signature group having similar diffraction signature. A subset of target patterns is selected to cover all possible diffraction-signature groups, such that the subset of target patterns represents at least a part of the design layout for the lithographic process. The grouping of the plurality of target patterns may be governed by predefined rules based on similarity of diffraction signature. The predefined rules comprise coverage relationships existing between the various diffraction-signature groups.

22 Claims, 22 Drawing Sheets

(56) References Cited

U.S. PATENT DOCUMENTS

| | | | |
|---|---|---|---|
| 5,969,441 | A | 10/1999 | Loopstra et al. |
| 6,046,792 | A | 4/2000 | Van Der Werf et al. |
| 6,541,167 | B2 * | 4/2003 | Petersen et al. ............... 430/5 |
| 6,670,081 | B2 | 12/2003 | Laidig et al. |
| 6,951,701 | B2 | 10/2005 | Hsu et al. |
| 7,003,758 | B2 | 2/2006 | Ye et al. |
| 7,342,646 | B2 | 3/2008 | Shi et al. |
| 7,587,704 | B2 | 9/2009 | Ye et al. |
| 2003/0073013 | A1 | 4/2003 | Hsu et al. |
| 2004/0156030 | A1 | 8/2004 | Hansen |
| 2004/0181768 | A1 * | 9/2004 | Krukar ............... 716/19 |
| 2004/0265707 | A1 | 12/2004 | Socha et al. |
| 2006/0204090 | A1 | 9/2006 | Socha et al. |
| 2007/0009146 | A1 | 1/2007 | Hoeks et al. |
| 2007/0009814 | A1 | 1/2007 | Oesterholt |
| 2007/0050749 | A1 | 3/2007 | Ye et al. |
| 2007/0121090 | A1 | 5/2007 | Chen et al. |
| 2009/0077527 | A1 | 3/2009 | Gergov et al. |
| 2009/0214984 | A1 | 8/2009 | Ling et al. |
| 2009/0268958 | A1 | 10/2009 | Kwang et al. |
| 2009/0271749 | A1 | 10/2009 | Tang et al. |
| 2010/0315614 | A1 | 12/2010 | Hansen |
| 2011/0047519 | A1 | 2/2011 | Torres Robles et al. |
| 2011/0099526 | A1 | 4/2011 | Liu |

FOREIGN PATENT DOCUMENTS

| | | |
|---|---|---|
| JP | 2004-312027 | 11/2004 |
| JP | 2005-183981 | 7/2005 |
| JP | 2006-324695 | 11/2006 |
| JP | 2007-158328 | 6/2007 |
| JP | 2011-100122 | 5/2011 |
| KR | 10-2004-0073364 | 8/2004 |
| KR | 10-0881127 | 2/2009 |
| WO | 2004/090952 | 10/2004 |

OTHER PUBLICATIONS

Cao et al., "Optimized Hardware and Software For Fast, Full Chip SImulation," Proc. SPIE, vol. 5754, pp. 407-414 (2005).

Alan E. Rosenbluth et al., "Optimum mask and source patterns to print a given shape," J. Microlith., Microfab., Microsyst., vol. 1, No. 1, pp. 12-39 (Apr. 2002).

Yuri Granik, "Source optimization for image fidelity and throughput," J. Microlith., Microfab., Microsyst., vol. 3, No. 4, pp. 509-522 (Oct. 2004).

International Search Report mailed Mar. 23, 2011 in corresponding International Patent Application No. PCT/EP2010/066106.

Kehan Tian et al., "Benefits and Trade-Offs of Global Source Optimization in Optical Lithography," Proc. of SPIE, vol. 7274, pp. 72740C-1-72740C-5 (Mar. 16, 2009).

Tamer H. Coskun et al., "Enabling process window improvement at 45nm and 32nm with free-form DOE illumination," Proc. of SPIE, vol. 7274, pp. 72740B-1-72740B-4 (Mar. 16, 2009).

Alan E. Rosenbluth et al., "Intensive Optimization of Masks and Sources for 22nm Lithography,"Proc. of SPIE, vol. 7274, pp. 727409-10-727409-14 (Mar. 16, 2009).

Robert Socha et al., "Simultaneous Source Mask Optimization (SMO)," Proc. SPIE, vol. 5853, No. 1, pp. 180-193 (2005).

Korean Office Action dated Dec. 19, 2011 in corresponding Korean Patent Application No. 10-2010-0105087.

Japanese Office Action mailed Jun. 22, 2012 in corresponding Japanese Patent Application No. 2010-235013.

Japanese Office Action mailed Jun. 15, 2012 in corresponding Japanese Patent Application No. 2010-235012.

U.S. Office Action dated May 2, 2013 in corresponding U.S. Appl. No. 13/505,286.

* cited by examiner

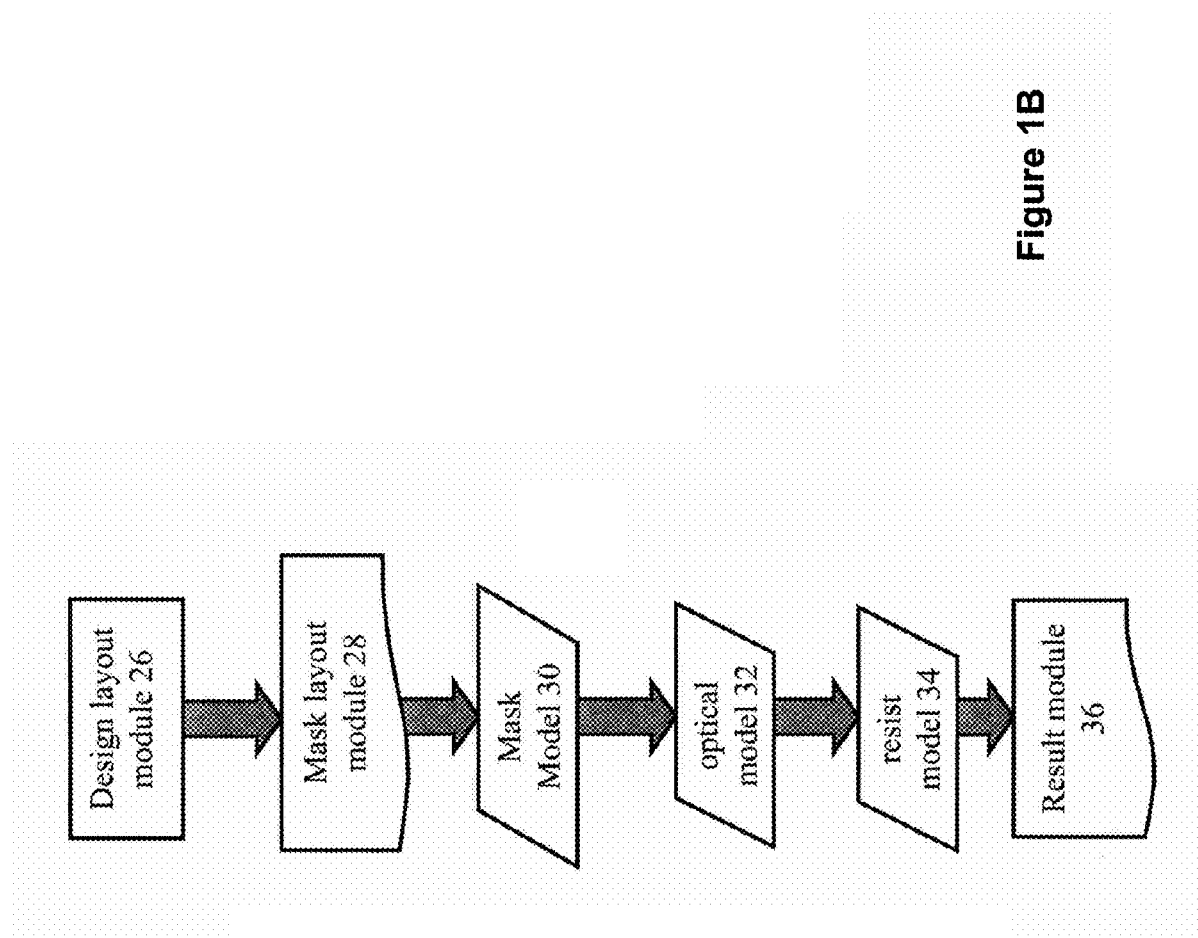

SELECTION OF OPTIMUM PATTERNS IN A DESIGN LAYOUT BASED ON DIFFRACTION SIGNATURE ANALYSIS

CROSS-REFERENCE TO RELATED APPLICATIONS

The present invention claims priority from U.S. Provisional Application No. 61/255,738, filed on Oct. 28, 2009, and also claims priority from U.S. Provisional Application No. 61/360,404, filed on Jun. 30, 2010, the contents of both applications are incorporated herein by reference in their entireties.

FIELD OF THE INVENTION

The present invention relates generally to selecting optimum patterns based on diffraction signature analysis, and more particularly to, using the optimum patterns for mask-optimization for lithographic imaging.

BACKGROUND OF THE RELATED ART

Lithographic apparatuses can be used, for example, in the manufacture of integrated circuits (ICs). In such a case, the mask may contain a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In one type of lithographic projection apparatus, each target portion is irradiated by exposing the entire mask pattern onto the target portion in one go; such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned.

In a manufacturing process using a lithographic projection apparatus, a mask pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g., an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc.

For the sake of simplicity, the projection system may hereinafter be referred to as the "lens"; however, this term should be broadly interpreted as encompassing various types of projection systems, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures.

The photolithographic masks referred to above comprise geometric patterns corresponding to the circuit components to be integrated onto a silicon wafer. The patterns used to create such masks are generated utilizing CAD (computer-aided design) programs, this process often being referred to as EDA (electronic design automation). Most CAD programs follow a set of predetermined design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or hole or the smallest space between two lines or two holes. Thus, the CD determines the overall size and density of the designed circuit. Of course, one of the goals in integrated circuit fabrication is to faithfully reproduce the original circuit design on the wafer (via the mask).

As noted, microlithography is a central step in the manufacturing of semiconductor integrated circuits, where patterns formed on semiconductor wafer substrates define the functional elements of semiconductor devices, such as microprocessors, memory chips etc. Similar lithographic techniques are also used in the formation of flat panel displays, micro-electro mechanical systems (MEMS) and other devices.

As semiconductor manufacturing processes continue to advance, the dimensions of circuit elements have continually been reduced while the amount of functional elements, such as transistors, per device has been steadily increasing over decades, following a trend commonly referred to as 'Moore's law'. At the current state of technology, critical layers of leading-edge devices are manufactured using optical lithographic projection systems known as scanners that project a mask image onto a substrate using illumination from a deep-ultraviolet laser light source, creating individual circuit features having dimensions well below 100 nm, i.e. less than half the wavelength of the projection light.

This process in which features with dimensions smaller than the classical resolution limit of an optical projection system are printed, is commonly known as low-$k_1$ lithography, according to the resolution formula $CD = k_1 \times \lambda / NA$, where $\lambda$ is the wavelength of radiation employed (currently in most cases 248 nm or 193 nm), NA is the numerical aperture of the projection optics, CD is the 'critical dimension'—generally the smallest feature size printed—and $k_1$ is an empirical resolution factor. In general, the smaller $k_1$, the more difficult it becomes to reproduce a pattern on the wafer that resembles the shape and dimensions planned by a circuit designer in order to achieve particular electrical functionality and performance. To overcome these difficulties, sophisticated fine-tuning steps are applied to the projection system as well as to the mask design. These include, for example, but not limited to, optimization of NA and optical coherence settings, customized illumination schemes, use of phase shifting masks, optical proximity correction in the mask layout, or other methods generally defined as 'resolution enhancement techniques' (RET).

As one important example, optical proximity correction (OPC, sometimes also referred to as 'optical and process correction') addresses the fact that the final size and placement of a printed feature on the wafer will not simply be a function of the size and placement of the corresponding feature on the mask. It is noted that the terms 'mask' and 'reticle' are utilized interchangeably herein. For the small feature sizes and high feature densities present on typical circuit designs, the position of a particular edge of a given feature will be influenced to a certain extent by the presence or absence of other adjacent features. These proximity effects arise from minute amounts of light coupled from one feature to another. Similarly, proximity effects may arise from diffusion and other chemical effects during post-exposure bake (PEB), resist development, and etching that generally follow lithographic exposure.

In order to ensure that the features are generated on a semiconductor substrate in accordance with the requirements of the given target circuit design, proximity effects need to be predicted utilizing sophisticated numerical models, and corrections or pre-distortions need to be applied to the design of the mask before successful manufacturing of high-end devices becomes possible. In a typical high-end design almost every feature edge requires some modification in order to achieve printed patterns that come sufficiently close to the target design. These modifications may include shifting or biasing of edge positions or line widths as well as application of 'assist' features that are not intended to print themselves, but will affect the properties of an associated primary feature.

For low k1 photolithography, optimization of both source and mask (i.e. source and mask optimization or SMO) is needed to ensure a viable process window for printing critical patterns. Reduction of total runtime of SMO can be achieved if the design layout of the mask is optimized. There exists a need for mask optimization by intelligently selecting representative patterns from a mask design layout, so that all critical mask features are adequately represented in a SMO process.

SUMMARY OF THE INVENTION

The present invention relates to intelligent pattern selection based on diffraction signature analysis, and more particularly to application of the intelligent pattern selection in a lithographic apparatus and process. An intelligently-selected representative set of target patterns may optionally be used to optimize an illumination source and/or a projection optics used in the lithographic process. However, the scope of the invention is not restricted to lithographic process optimization. Embodiments of the invention are applicable to any situation where a subset of target patterns needs to be chosen from a larger set of target patterns generated from a design layout, such that all the critical features of the target patterns in the design layout are adequately represented by the subset of target patterns.

In one aspect of the present invention, a method of selecting a subset of target patterns from a design layout is disclosed, the method comprising the steps of: generating a respective diffraction map for a plurality of target patterns from an initial larger set of target patterns from the design layout; identifying diffraction signatures from the various diffraction maps of the plurality of target patterns from the initial larger set of target patterns; grouping the plurality of target patterns from the initial larger set of target patterns into diffraction-signature groups, the target patterns in a specific diffraction-signature group having similar diffraction signature; and selecting the subset of target patterns to cover a predefined number of diffraction-signature groups, such that the subset of target patterns represents at least a part of the design layout for the lithographic process. In an embodiment of the invention, the predefined number of diffraction-signature groups comprises all possible diffraction signature groups. The grouping of the plurality of target patterns may be governed by predefined rules based on similarity of diffraction signature. The predefined rules comprise coverage relationships existing between the various diffraction-signature groups.

In another aspect of the present invention, a method of selecting a representative set of target patterns in a design layout is disclosed, the method comprising the steps of: generating a respective diffraction map for each of an initial larger set of target patterns in the design layout; identifying peaks in each of the diffraction maps; storing one or more characteristic parameters of the identified peaks in each of the diffraction maps; analyzing the stored characteristic parameters of the identified peaks to create a list of diffraction-signature groups, each diffraction-signature group having one or more respective basis vectors; inspecting coverage relationships existing between the various diffraction-signature groups from the various diffraction maps of the initial larger set of target patterns, wherein the coverage relationships are governed by predefined rules; identifying a final subset of target patterns whose diffraction-signature groups adequately cover all possible diffraction-signature groups from all the diffraction maps; and, selecting the final subset of target patterns to be included in the representative set of target patterns, such that the final subset of target patterns represents at least a part of the design layout for the lithographic process.

In a further aspect of the present invention, a computer program product is disclosed, comprising a computer-readable medium having instructions recorded therein, which when executed, cause the computer to perform the pattern selection methods mentioned above.

These and other features, embodiments, and advantages of the present invention will be apparent to a person skilled in the art in view of the following illustrations and detailed description.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 1B is an exemplary block diagram illustrating the functional modules of a lithographic simulation model.

FIGS. 16A-16B show screenshots of user interfaces from the pattern selector module of FIG. 15.

DETAILED DESCRIPTION

Figure 1A:
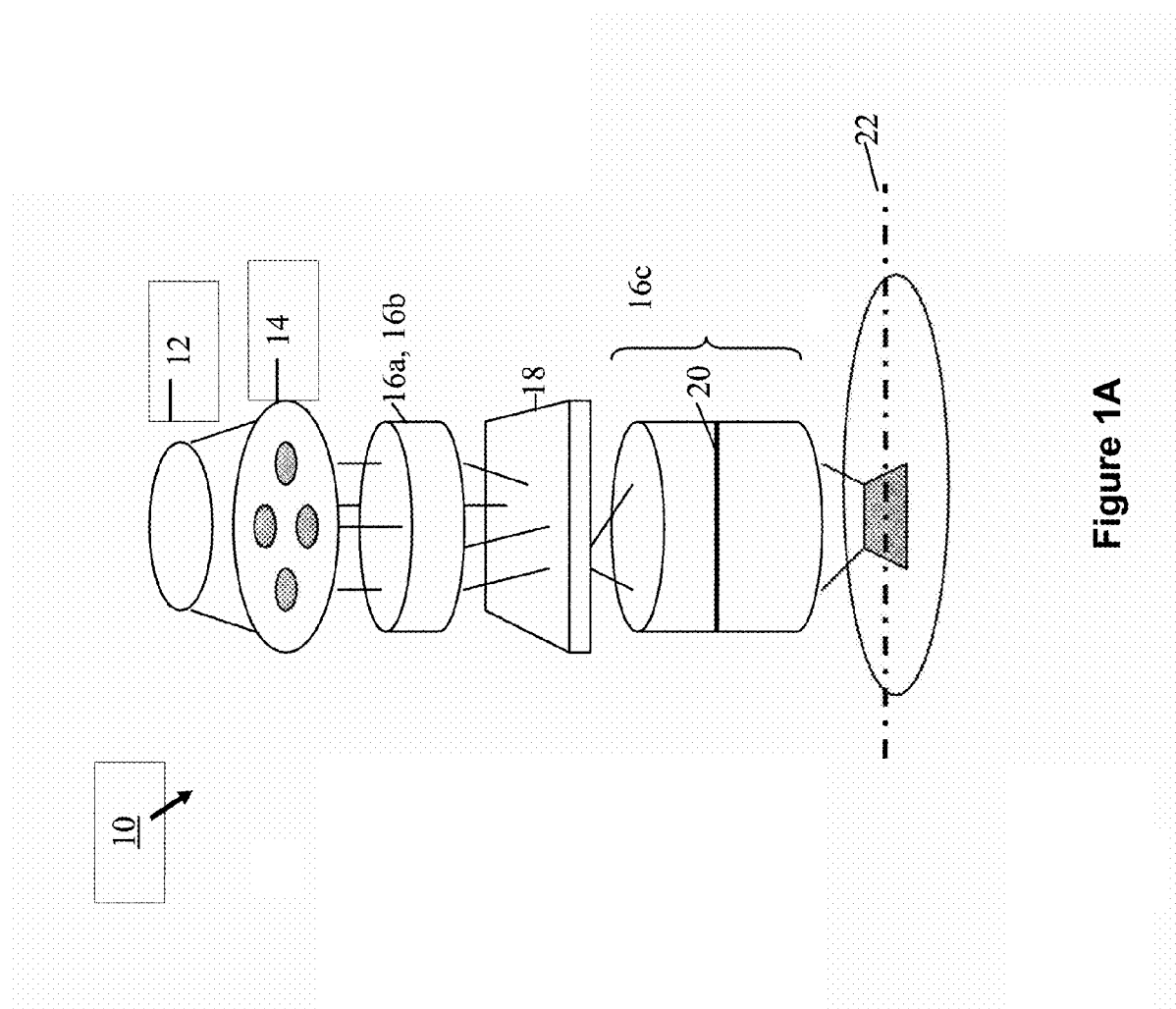
FIG. 1A is an exemplary block diagram illustrating a typical lithographic projection system.

The present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. Embodiments described as being implemented in software should not be limited thereto, but can include embodiments implemented in hardware, or combinations of software and hardware, and vice-versa, as will be apparent to those skilled in the art, unless otherwise specified herein. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

Although specific reference may be made in this text to the use of the invention in the manufacture of ICs, it should be explicitly understood that the invention has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm).

The term mask as employed in this text may be broadly interpreted as referring to generic patterning means that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning means include:

a programmable mirror array. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. The required matrix addressing can be performed using suitable electronic means. More information on such mirror arrays can be gleaned, for example, from U.S. Pat. Nos. 5,296,891 and 5,523,193, which are incorporated herein by reference.

a programmable LCD array.

General Environment in a Lithographic System for Implementing Example Embodiments of the Present Invention Prior to discussing the present invention, a brief discussion regarding the overall design and imaging process is provided. FIG. 1A illustrates an exemplary lithographic projection system 10. The major components are a light source 12, which may be a deep-ultraviolet excimer laser source, illumination optics which define the partial coherence (denoted as sigma) and which may include specific source shaping optics 14, 16a and 16b; a mask or reticle 18; and projection optics 16c that produce an image of the reticle pattern onto the wafer plane 22. An adjustable filter or aperture 20 at the pupil plane may restrict the range of beam angles that impinge on the wafer plane 22, where the largest possible angle defines the numerical aperture of the projection optics $NA=\sin(\Theta_{max})$.

In a lithography simulation system, these major system components can be described by separate functional modules, for example, as illustrated in FIG. 1B. Referring to FIG. 1B, the functional modules include the design layout module 26, which defines the target design; the mask layout module 28, which defines the mask to be utilized in the imaging process; the mask model module 30, which defines the model of the mask layout to be utilized during the simulation process; the optical model module 32, which defines the performance of the optical components of lithography system; and the resist model module 34, which defines the performance of the resist being utilized in the given process. As is known, the result of the simulation process produces, for example, predicted contours and CDs in the result module 36.

More specifically, it is noted that the properties of the illumination and projection optics are captured in the optical model 32 that includes, but not limited to, NA-sigma ($\sigma$) settings as well as any particular illumination source shape (e.g. off-axis light sources such as annular, quadrupole, and dipole, etc.). The optical properties of the photo-resist layer coated on a substrate—i.e. refractive index, film thickness, propagation and polarization effects—may also be captured as part of the optical model 32. The mask model 30 captures the design features of the reticle and may also include a representation of detailed physical properties of the mask. Finally, the resist model 34 describes the effects of chemical processes which occur during resist exposure, PEB and development, in order to predict, for example, contours of resist features formed on the substrate wafer. The objective of the simulation is to accurately predict, for example, edge placements and CDs, which can then be compared against the target design. The target design, is generally defined as the pre-OPC mask layout, and will be provided in a standardized digital file format such as GDSII or OASIS.

Example Methods of the Present Invention

In a typical high-end design almost every feature edge requires some modification in order to achieve printed patterns that come sufficiently close to the target design. These modifications may include shifting or biasing of edge positions or line widths as well as application of 'assist' features that are not intended to print themselves, but will affect the properties of an associated primary feature. Furthermore, optimization techniques applied to the source of illumination may have different effects on different edges and features. Optimization of illumination sources can include the use of pupils to restrict source illumination to a selected pattern of light. The present invention provides optimization methods that can be applied to both source and mask configurations.

Source-mask optimization (SMO) is a process where mask design layout and illumination source are co-optimized for producing a high-fidelity image on the substrate. In general, a SMO method aims to achieve full chip pattern coverage while lowering the computation cost by intelligently selecting a small set of critical design patterns from the full set of clips to be used in SMO. SMO is performed only on these selected patterns to obtain an optimized source. The optimized source is then used to optimize the mask (e.g. using OPC and LMC) for the full chip, and the results are compared. If the results are comparable to conventional full-chip SMO, the process ends, otherwise various methods are provided for iteratively converging on the successful result.

The present invention provides a technique for selecting a smaller representative set of target patterns from a larger set of target patterns, wherein the representative set of target patterns adequately represent preferably all the critical features of the full design layout. The larger set of target patterns may comprise the entire design layout of a mask, or a substantially large portion of the design layout. Although the embodiments of the present invention is particularly suited to SMO, persons skilled in the art will understand that the pattern selection algorithms are universally applicable to any situation where a bigger design layout needs to be represented adequately by intelligently selected smaller set of target patterns from the design layout. In fact, some advantages of the diffraction order based pattern selection method described here are that no starting condition is required (e.g. starting illumination source may be an uniform illumination rather than an optimized illumination source with tuned polarization distribution), no resist model is required, and no OPC models or sub-resolution assist feature (SRAF) are required. It only requires the target pattern, so it is process-independent.

A representative set of target patterns may comprise user-selected clips picked manually, and pattern-selection algorithm-selected clips picked automatically. For example, an anchor clip, which is usually the clip that has known highest density of line/space features, may be manually selected by the user to always be part of the representative set.

The representative set of target patterns may be used to optimize an illumination source used in the lithographic process. Optimizing the illumination source may include tuning polarization distribution of a radiation beam incident on a mask. The representative set of target patterns may also be used to optimize a projection optics system used in the lithographic process. Optimizing the projection optics system may include manipulating a wavefront of the radiation beam in a pupil plane after the radiation beam passes through the mask. In this regard it is important to mention that the optimized projection optics not necessarily requires that the optimized projection optics system is free from aberrations or has a lowest possible level of aberrations which is possible for this particular projection optics system. The optimization of the projection optics rather means that the projection optics are tuned or optimized such that they represent the best imaging settings for the target patterns to be imaged using these projection optics. As such, the optimized projection optics may comprise residual aberrations or may even be tuned away from a lowest possible aberration state when such optimized projection optics is beneficial for imaging the target pattern. To determine whether the projection optics is optimal for a specific target pattern, lithographic performance parameters for imaging the target pattern may be used. Such lithographic performance parameters may include but are not limited to Depth of Focus, a dimension of the Process Window, Mask Error Enhancement Factor, Critical Dimension Uniformity, Edge Placement Error and (Normalized) Image Log Slope.

A target design layout (typically comprising a layout in a standard digital format such as OASIS, GDSII, etc.) for which a lithographic process is to be optimized may include memory, test patterns and logic. From this design layout, the initial larger set of target patterns (clips) is identified. In a specific embodiment of the invention, a full set of clips is extracted, which represents all the complicated patterns in the design layout (typically about 50 to 1000 clips, although any number of clips may be used). As will be appreciated by those skilled in the art, these patterns or clips represent small portions (i.e. circuits, cells or patterns) of the design and especially the clips represent small portions for which particular attention and/or verification is needed.

The initial larger set of clips may be provided a priori by a customer based on known critical feature areas in a design layout which require particular image optimization. Alternatively, in another embodiment of the present invention, the initial larger set of clips may be extracted from the entire design layout by using some kind of automated (such as, machine vision) or manual algorithm that identifies the critical feature areas.

The larger set of patterns may, for example, comprise different pattern types, such as gate or logic patterns, or may, for example, comprise patterns having a specific orientation. The larger set of patterns may, for example, also comprise patterns comprising a certain level of complexity or patterns requiring particular attention and/or verification during the lithographic processing, for example, specific test structures complying to design rules, like 1D through pitch, staggered through pitch, commonly used design constructs or primitives (e.g., elbows, T shapes, H shapes), repeatedly used layout structures like memory cells (e.g., brick walls), memory periphery structures (e.g., hooks to memory cells), and patterns with known imaging issues from previous generation, etc. The larger set of patterns may, for example, further comprise patterns having a predefined process window performance or, for example, comprise patterns comprising a sensitivity to process parameter variations of the pattern.

A small subset of patterns or clips (e.g. 15 to 50 clips, although any number can be used) is selected from the initial larger set of clips. As will be explained in more detail below, the selection of the subset of patterns or clips is preferably performed such that the process window of the selected patterns as closely as possible matches the process window for the larger set of critical patterns. The effectiveness of the selection is also measured by the total turn-around time or run time reduction in the combined pattern-selection and subsequent SMO process.

Figure 2:
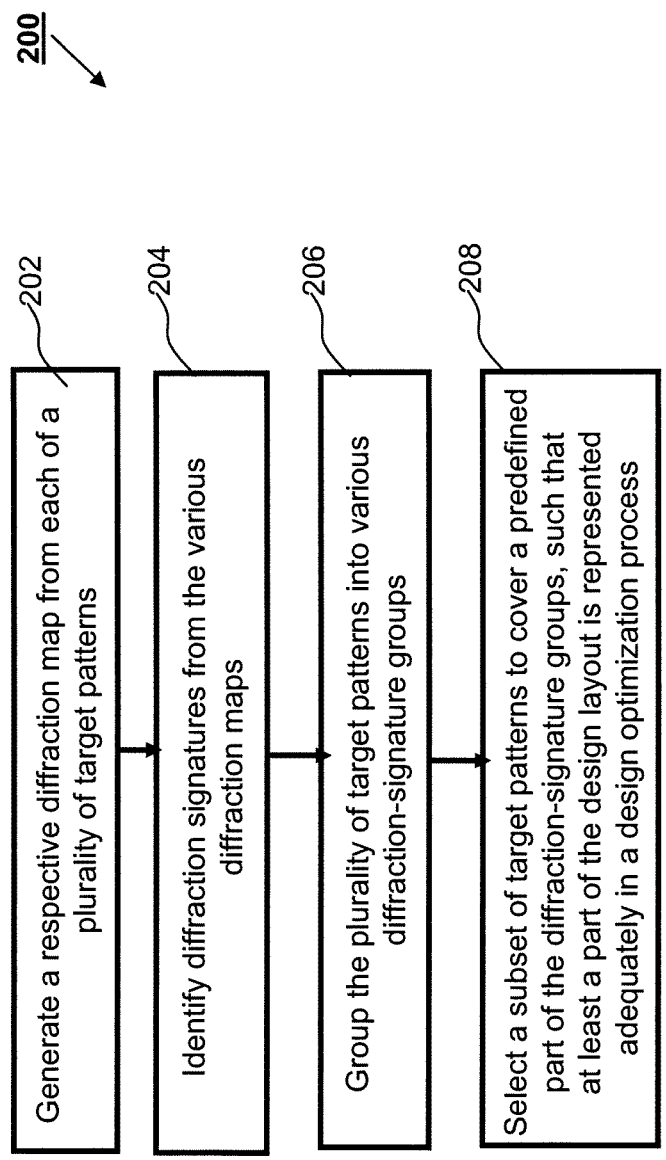
FIGS. 2-4 illustrate various example methods, according to embodiments of the present invention.

Flowchart 200 in FIG. 2 is an exemplary flowchart illustrating some key steps of a method of diffraction-based pattern selection, in accordance with an embodiment of the present invention.

In step 202, a respective diffraction map is generated from each of a plurality of target patterns. Each of the plurality of target patterns may be included in a corresponding clip. The clips constitute the initial larger set of target patterns, as discussed before. The clips may be provided by the customer, or may be extracted from the design layout as a precursor step of the pattern selection method.

In step 204, characteristics diffraction signatures of the target patterns are identified from the various diffraction maps.

In step 206, the plurality of target patterns is grouped into various diffraction-signature groups, the target patterns in a specific diffraction-signature group having similar diffraction signature. Diffraction-signature grouping may be done in frequency domain or in spatial domain.

In step 208, a subset of target patterns or clips are selected that cover all possible diffraction-signature groups, such that at least a part of the design layout (or the entire design layout) is represented adequately in a design optimization process, including, but not limited to, a SMO process used in a lithographic image transfer process flow.

Figure 3:
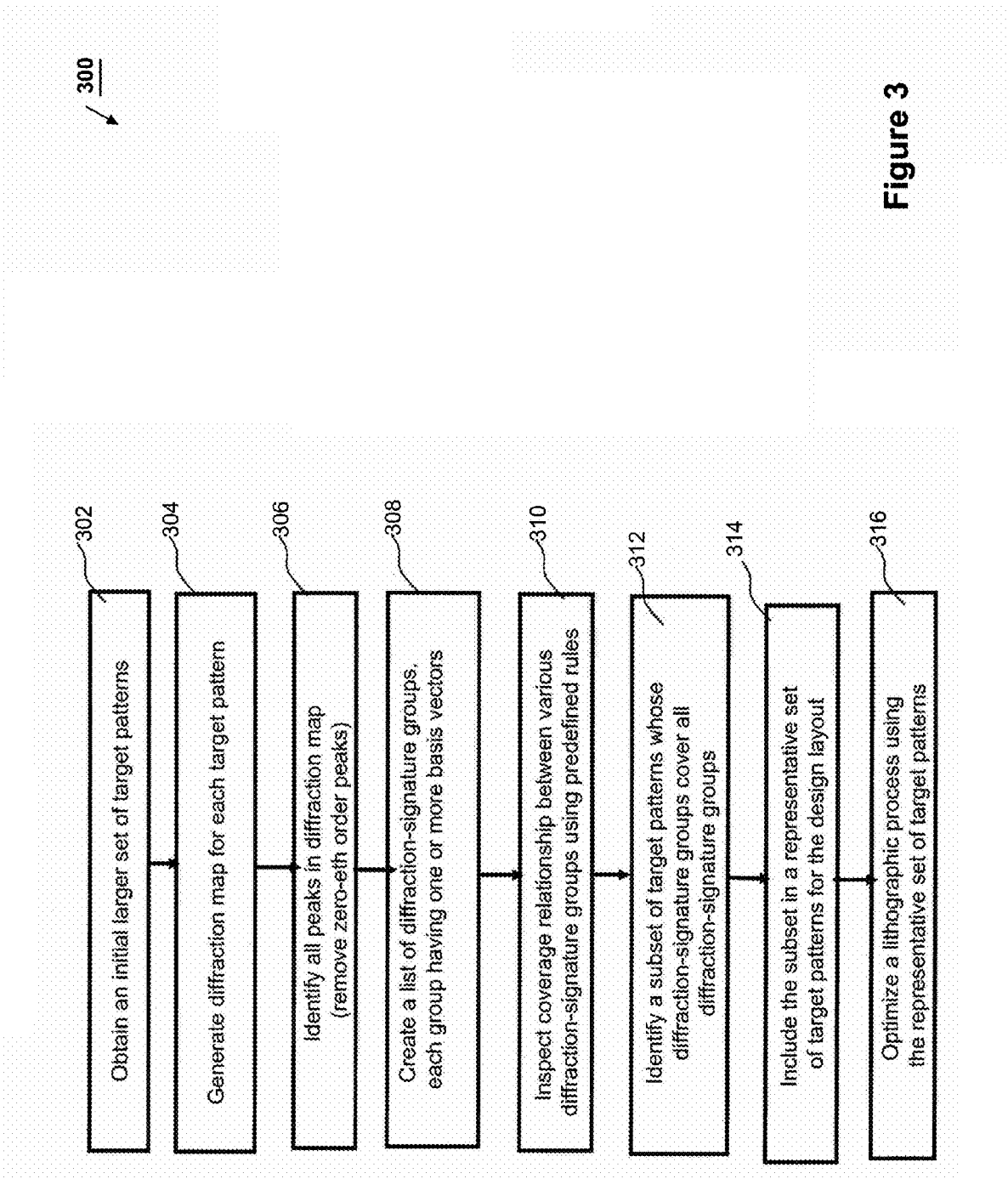

Flowchart 300 in FIG. 3 is another exemplary flowchart illustrating steps of a method of diffraction-based pattern selection in further details, in accordance with an embodiment of the present invention.

In step 302, an initial larger set of target patterns is obtained (either customer-supplied, or extracted from the design layout).

In step 304, diffraction map is generated for each of the target patterns.

In step 306, all peaks are identified in each of the diffraction maps. Usually, zero-eth order peaks are removed from the diffraction maps. In some cases, peaks whose amplitude are below a certain predefined threshold range are discarded to simplify the pattern selection algorithm as their contribution in image optimization is likely to be insignificant.

In step 308, a list of diffraction-signature groups is created. The diffraction-signature groups may be based on diffraction-order mapping in spatial domain or frequency domain. Each diffraction-signature group has one or more basis vectors, as will be explained later. The diffraction-signature grouping is done by analyzing characteristic parameters of the peaks identified in step 306. Example of characteristic parameters of the peaks include, but are not limited to, location of each peak, width of each peak, amplitude of each peak, harmonic index of each peak, distance of each peak from one or more neighboring peaks, etc. Also additional characteristic parameters may be stored and may, for example, include a phase of the light which generates the identified peaks, for example at the pupil plane, or a difference of the phase between different peaks. This phase information may, for example, be used to select a representative set of target patterns which may be representative to optimize or improve the wavefront of the radiation beam in a pupil plane after the radiation beam passes through the mask.

In step 310, coverage relationship existing between the various diffraction signature groups from the various diffraction maps are inspected. The coverage relationships are governed by a predefined set of rules, which will be discussed later.

In step 312, a subset of target patterns (or clips) are identified, whose diffraction-signature groups cover all possible diffraction-signature groups from the various diffraction maps generated from the various target patterns, i.r. from the initial larger set of clips.

In step 314, the subset of target patterns are included in a representative set of target patterns that adequately represents the entire design layout or at least a part of the design layout. The representative set of target patterns may include user-selected target patterns too. For example, when the user is already aware that a particular clip (or a particular set of clips) has a target pattern that should be used for SMO optimization (such as an anchor clip with high-density line/space patterns), then that clip(s) is always included in the representative set.

Though the present invention is not limited to lithographic optimization process, the results of the pattern-selection algorithm is often used for optimizing a lithographic process, such as SMO, as shown in the optional terminal step 316.

Figure 4:
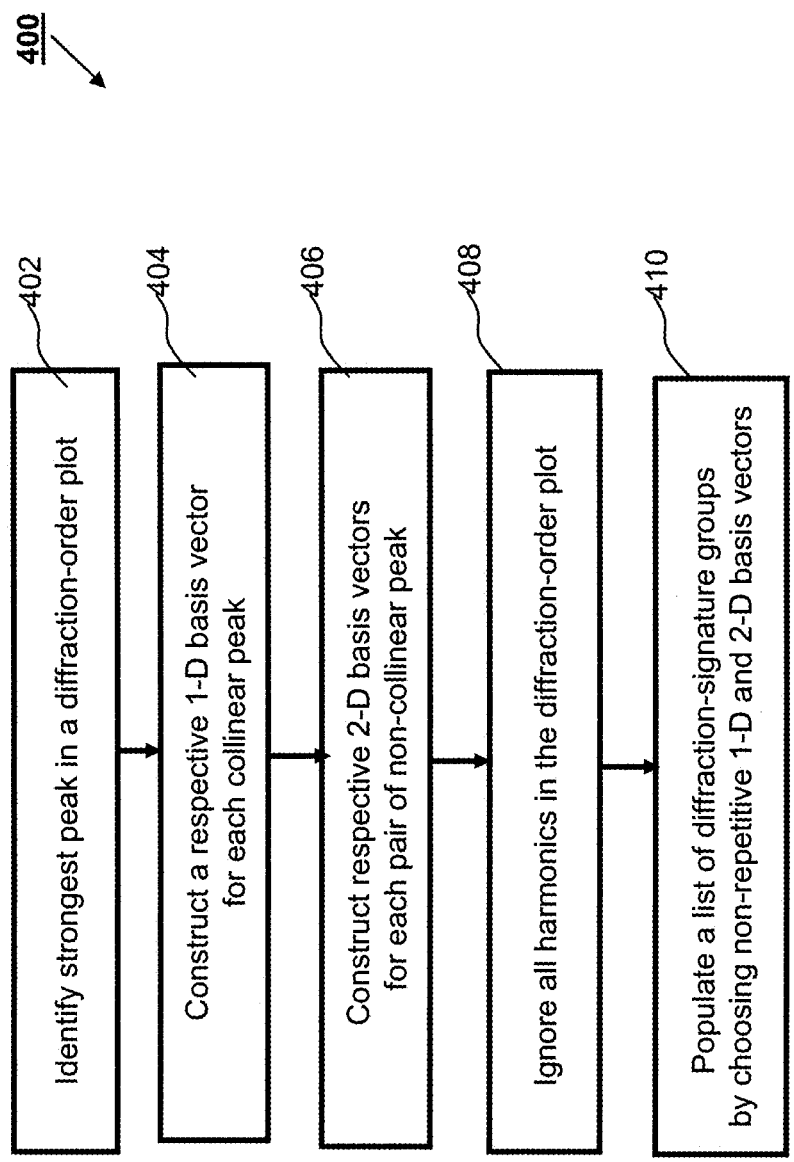
Figures 5A, 5B:
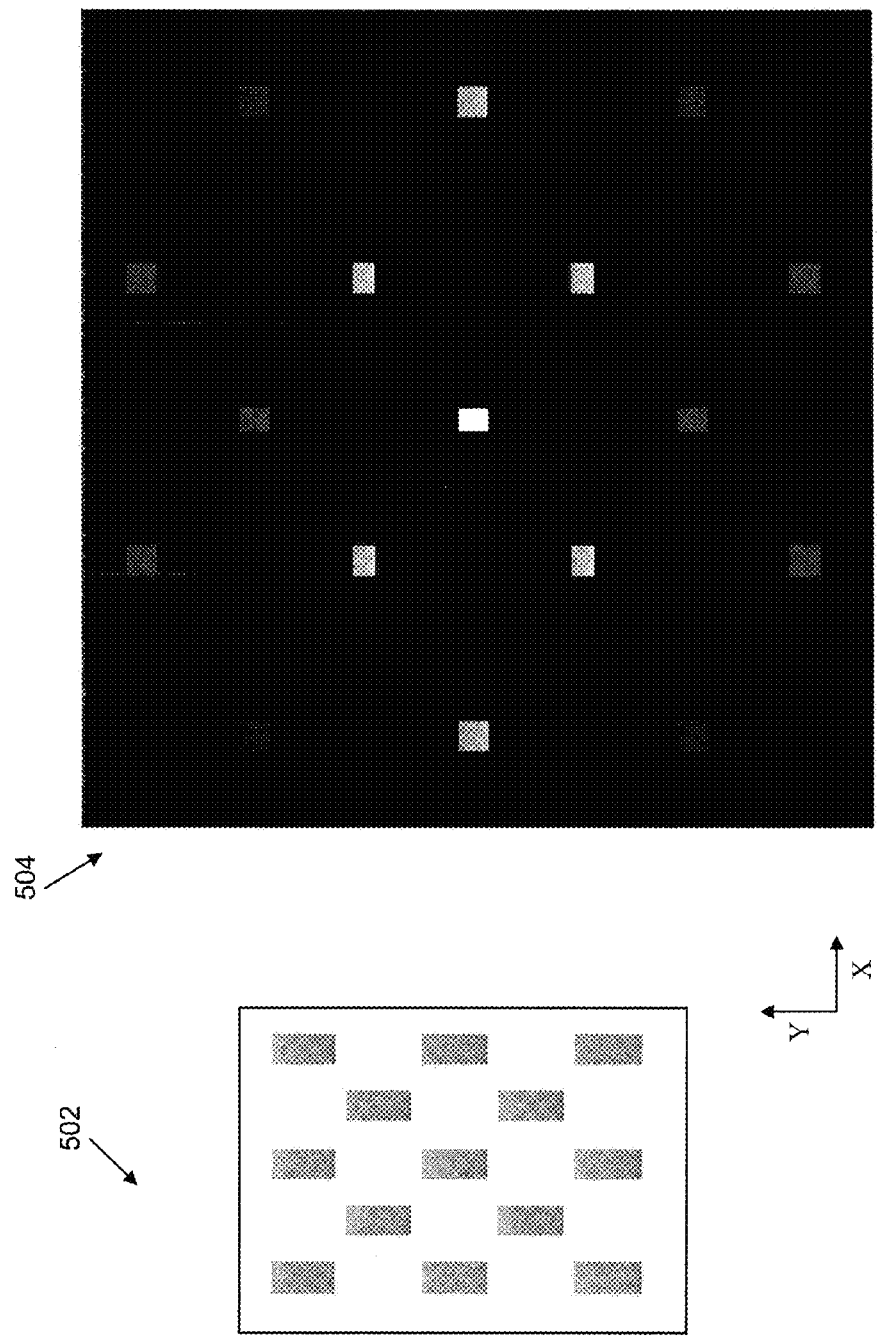
FIGS. 5A-5B, 6A-6B, 7A-7B, 8A-8B illustrate various target patterns and corresponding diffraction maps, according to embodiments of the present invention.

Flowchart 400 in FIG. 4 shows an exemplary flowchart illustrating steps of diffraction-signature-based grouping, as described in step 308 of flowchart 300. Flowchart 400 shows steps after a diffraction map, referred here as a diffraction-order plot, is created, zero-eth order peak has been removed, and the other peaks have been identified. A list, referred to as a 'peak_list,' may be created, to record each peak's location (x,y), width in x and y directions ($s_x$, $s_y$) and amplitude (h).

In step 402, the strongest peak, $v=(x,y, s_x, s_y, h)$ of the diffraction-order plot is identified.

In step 404, a respective 1-D basis vector is constructed for each collinear peak corresponding to a 1-D pattern.

In step 406, respective 2-D basis vectors are constructed for each pair of non-collinear peaks generated by a 2-D pattern. For example, for a peak pair ($v_1$, $v_2$), two basis vectors are constructed.

In step 408, all harmonics of the strongest peak 'v' from the peak_list are removed. For example, peaks at ($n_x$, $n_y$) for all integers 'n' are removed for collinear peaks. Similarly, peaks of the form '$n_1 v_1 + n_2 v_2$' are removed for all integer pairs ($n_1$, $n_2$) for non-collinear peak pair ($v_1$, $v_2$).

These steps may be repeated until the peak_list is empty, and all 1-D and 2-D basis vectors are shifted to a list, that may be referred to as a 'basis_list.'

In step 410, a list of diffraction-signature groups is populated by non-repetitive 1-D and 2-D basis vectors included in the basis_list. The diffraction-signature groups are now ready for subsequent inspection of coverage relationship.

Persons skilled in the art will appreciate that the methods shown in FIGS. 2-4 only depict illustrative steps. Not all the steps need to be included in every embodiment, and additional intermediate/terminal steps may be included in the methods, as applicable. The sequence of the steps may be altered.

FIGS. 5-8 illustrate examples of various target patterns and corresponding diffraction maps, according to embodiments of the present invention. FIG. 5A shows a target pattern or clip 502 comprising a staggered 2-D array of rectangular features. Diffraction map 504 of clip 502 is shown in FIG. 5B. The peaks (with a distribution of energy around a center point) of the diffraction map 504 are shown as the bright localized rectangular regions. Typically, only the peaks whose amplitudes are above a certain threshold are considered for the pattern selection algorithm. Also, the zero-eth order peak at the center is removed to simplify the pattern selection algorithm.

Figures 6A, 6B:
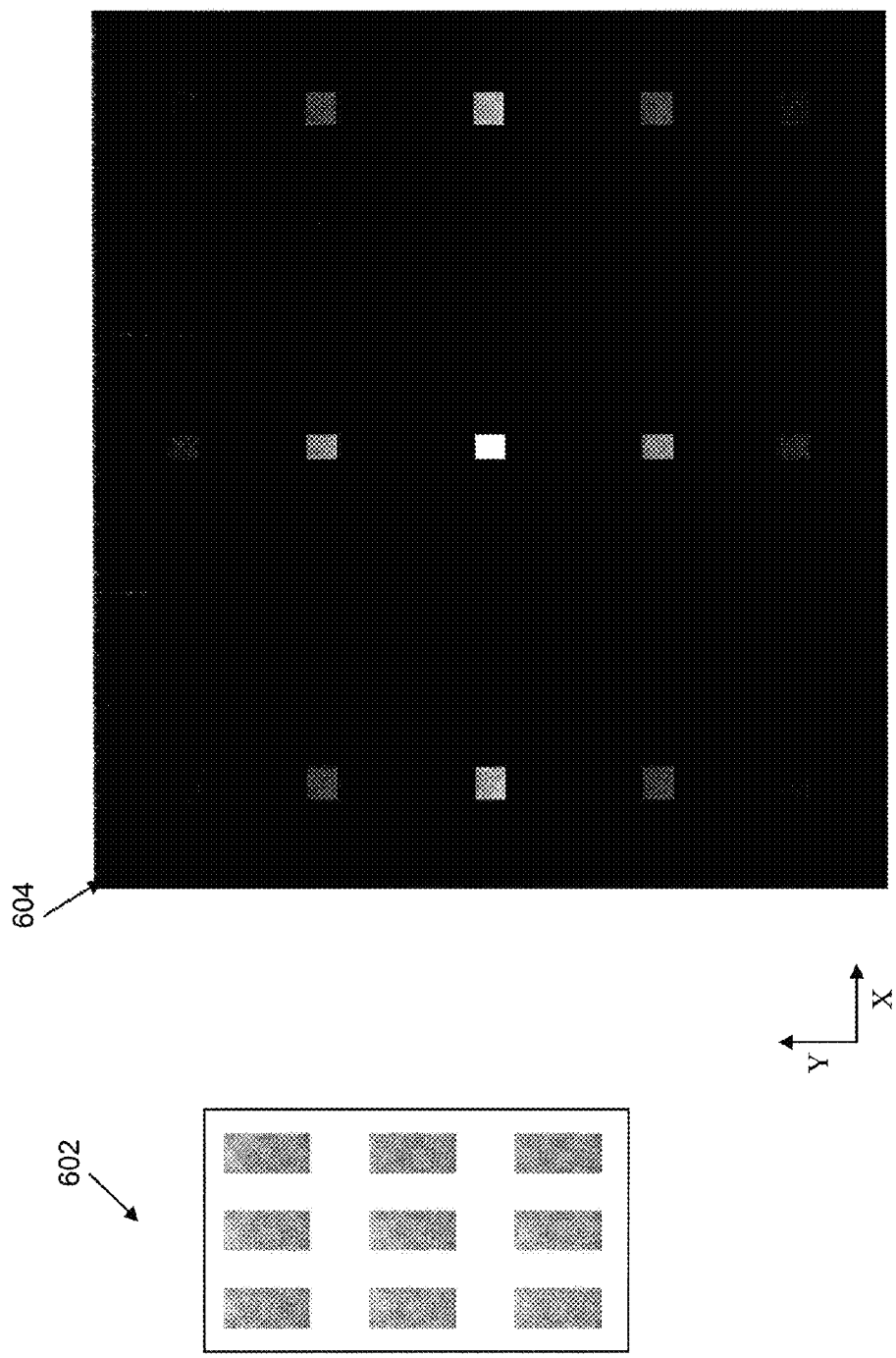

FIG. 6A shows a target pattern or clip 602 comprising a regular 2-D array of rectangular features. Diffraction map 604 of clip 602 is shown in FIG. 6B.

Figure 7B:
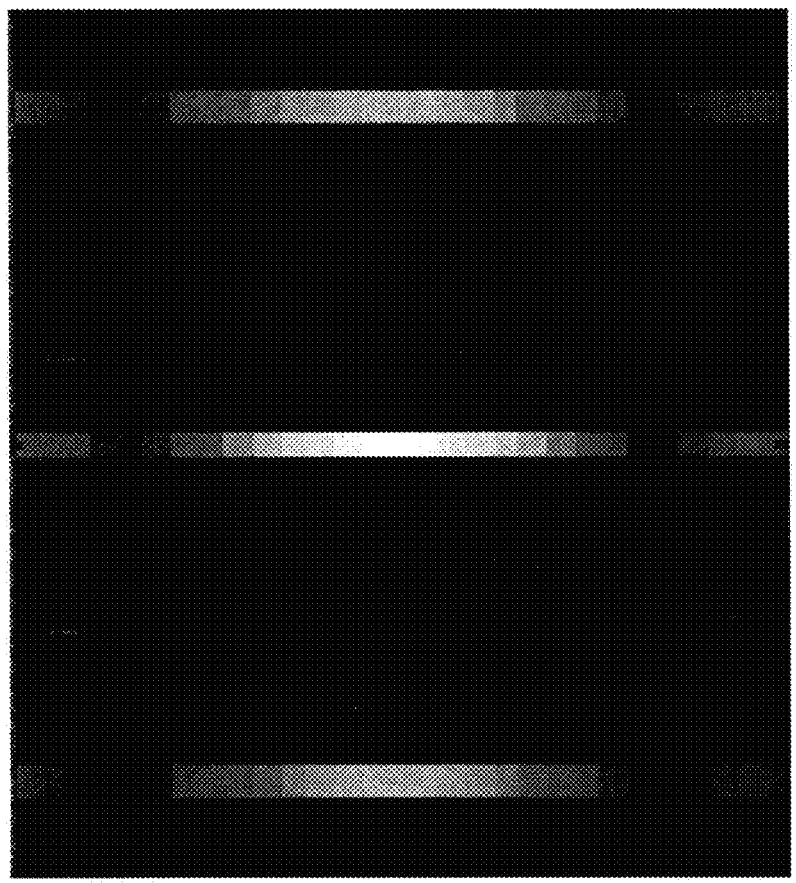
Figure 7A:
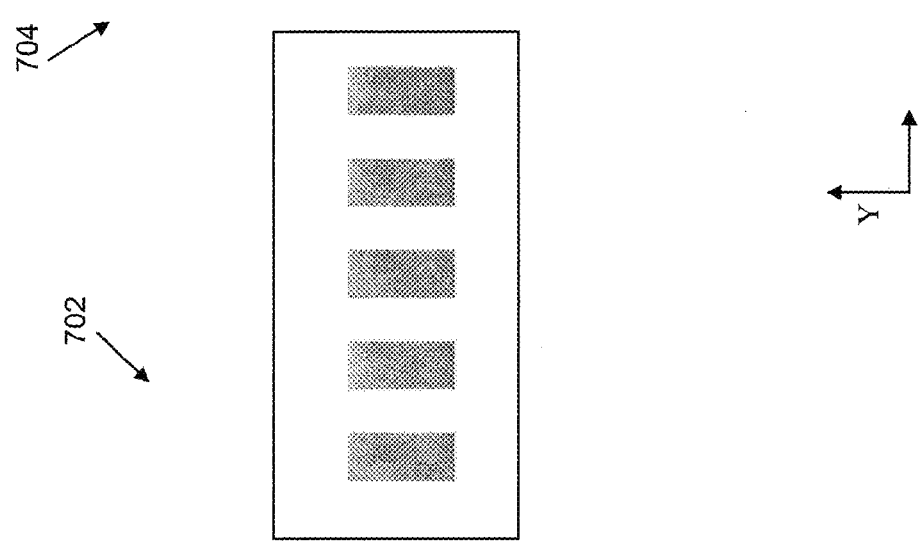

FIG. 7A shows a target pattern or clip 702 comprising a 1-D array of rectangular features. Diffraction map 704 of clip 702 is shown in FIG. 7B. Note that the peaks in diffraction map 704 are overlapping with each other along corresponding lines parallel to y-axis.

Figures 8A, 8B:
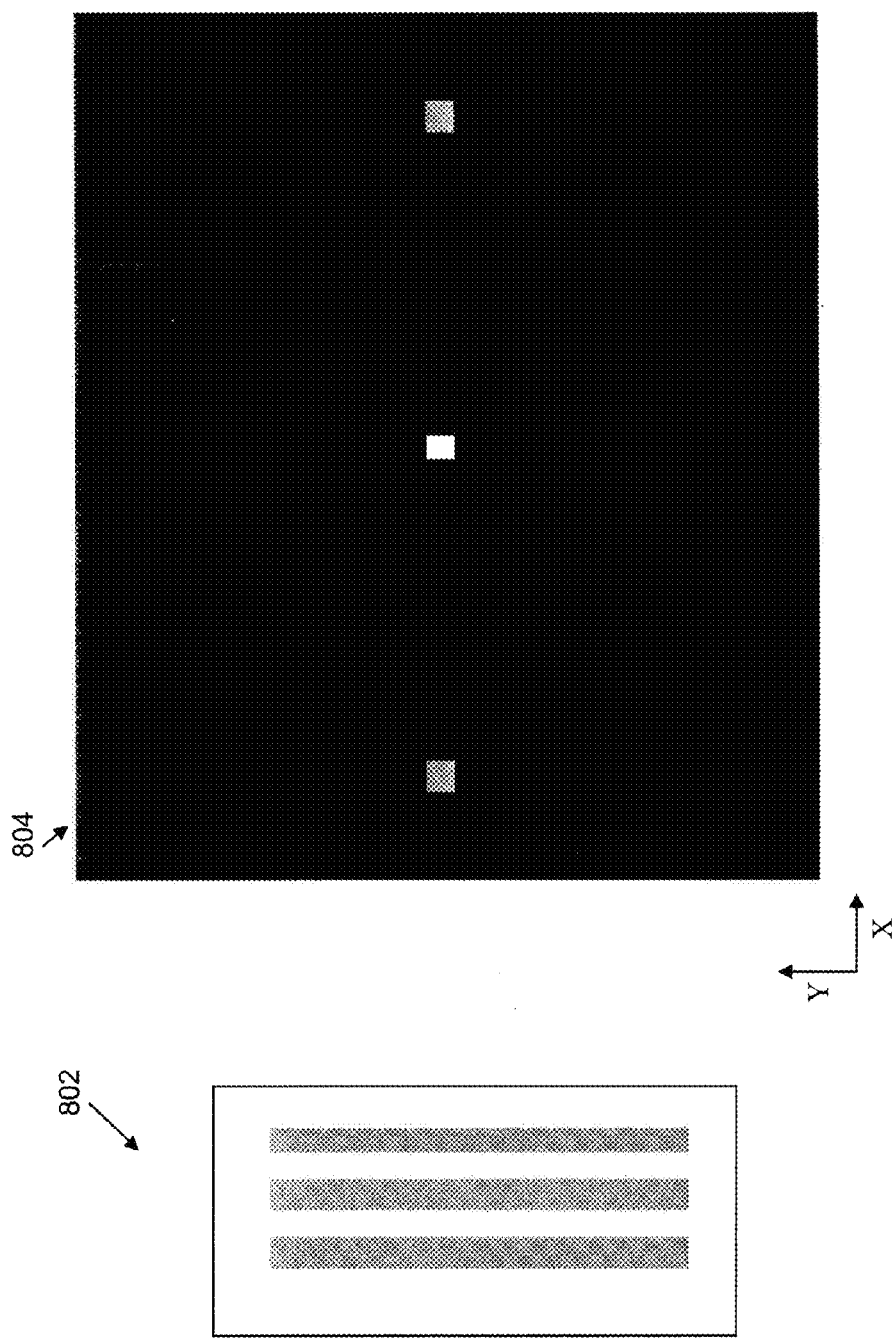

FIG. 8A shows a target pattern or clip 802 comprising a 1-D array of lines of finite length. Diffraction map 804 of clip 802 is shown in FIG. 8B.

Figure 9A:
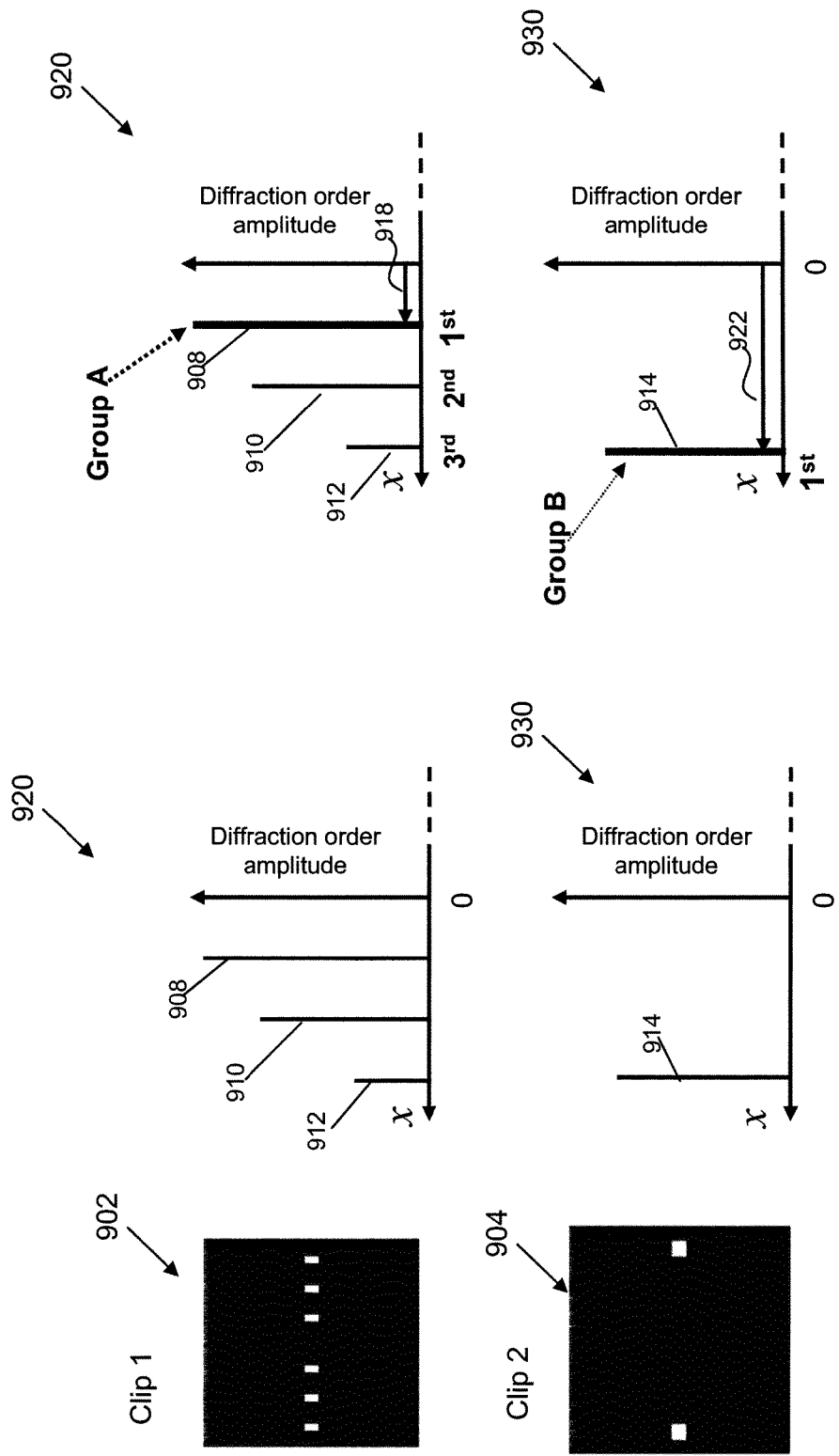
FIGS. 9A-9B illustrates the overall principle of pattern selection using an example embodiment.
Figure 9B:
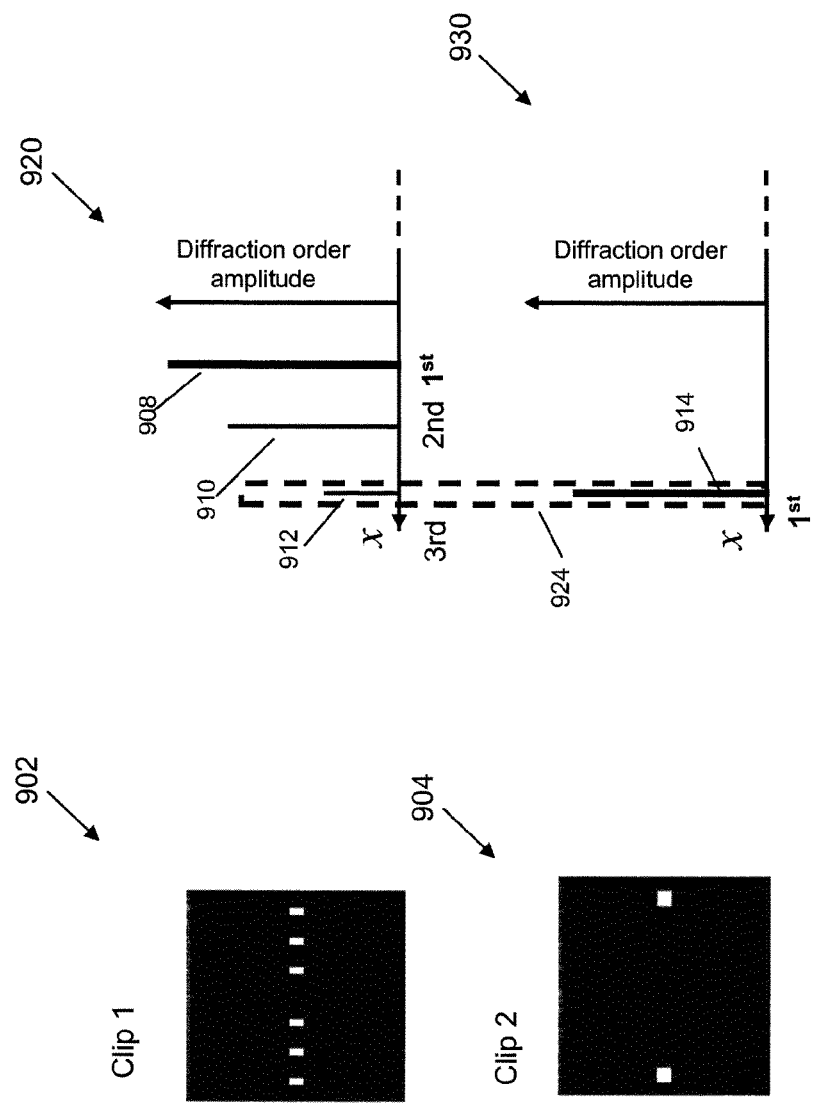

FIGS. 9A-9B illustrate the overall principle of pattern selection using an example embodiment. 902 and 904 are respective diffraction maps obtained from two clips, viz., clip 1 and clip 2. Clip 1 is a 1-D array of features with a 240 nm pitch. Clip 2 is a 1-D array of features with an 80 nm pitch. These specific dimensions are for non-limiting illustration purpose only. It will be demonstrated that clip 2 adequately covers the diffraction signature of clip 1, so there is no need to select both clip 1 and clip 2. Selecting clip 2 is enough for SMO and other purposed. Diffraction maps 902 and 904 are symmetrical, so only one half of the diffraction-order grouping is shown in diffraction-signature grouping plots 920 (corresponding to clip 1) and 930 (corresponding to clip 2). Zero-eth order peaks are removed from the center of each diffraction map 902 and 904.

Lines 908, 910 and 912 in plot 920 refer to amplitude and location of the $1^{st}$, $2^{nd}$ and $3^{rd}$ diffraction-order peaks for clip 1. Line 914 in plot 930 refers to amplitude and location of the $1^{st}$ diffraction-order peak for clip 2. These plots are in frequency domain. So the $1^{st}$-order peak 914 of clip 2 has a higher frequency (further along the x axis) than the 1st order peak 908 of clip 1, owing to the denser pitch in clip 2. The three identified peaks 908, 910 and 912 are grouped together as Group A. A unique basis vector 918 represents all three peaks 908, 910 and 912 in Group A. Group B comprises the only identified peak 914 from clip 2. A unique basis vector 922 represents the peak 914 in Group B.

In FIG. 9B, it is shown that there exists a coverage relationship between Group A and Group B due to the overlap of peak 912 from clip 1 and peak 914 from clip 2. The dashed line 924 encompassing peaks 912 and 914 indicate the existence of overlap. Due to the overlap, Group B (with higher basis frequency) covers Group A (with lower basis frequency). So by selecting only clip 2, the characteristics of the target pattern features of both clips 1 and clip 2 are represented.

Figure 10:
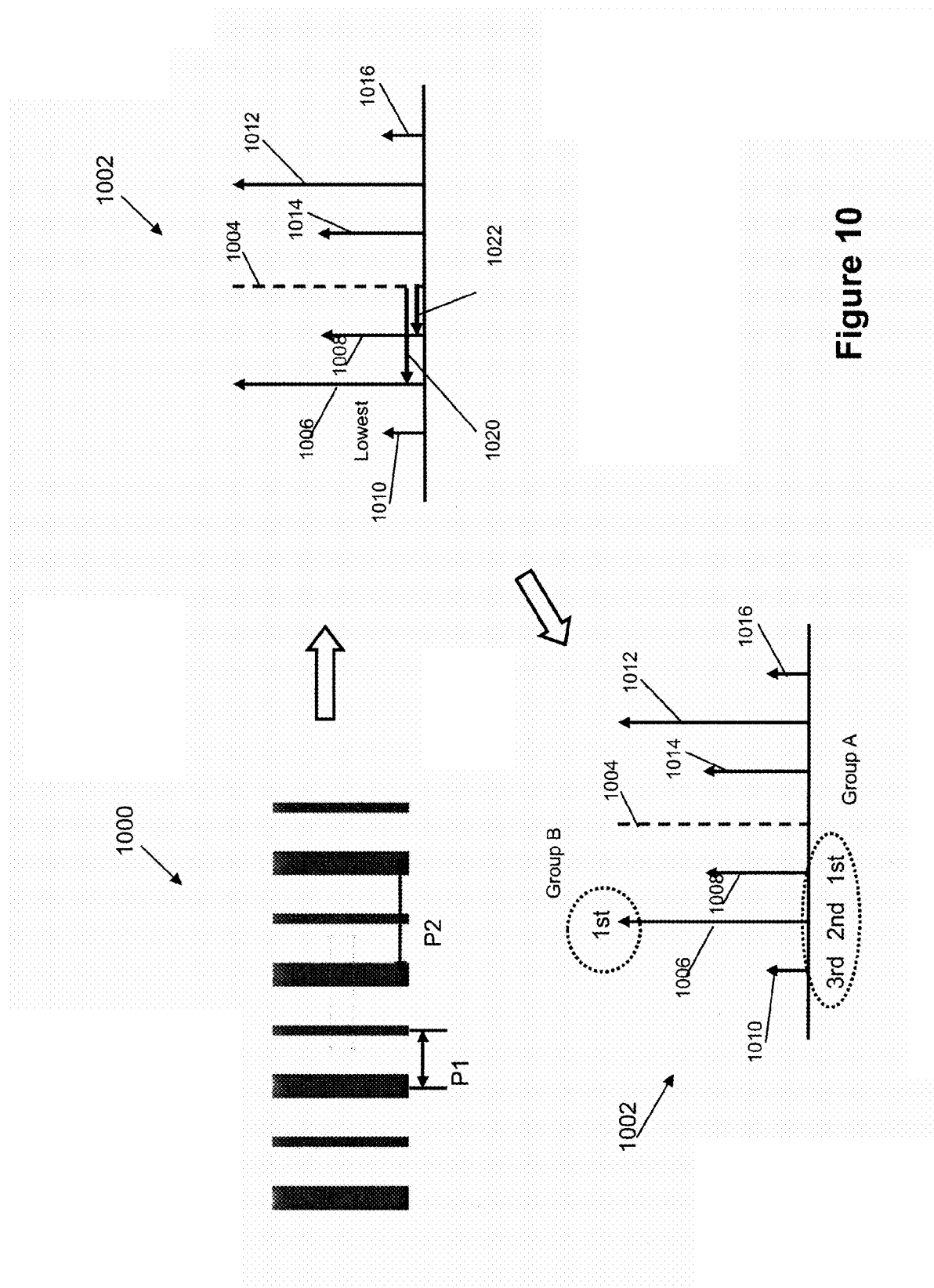
FIG. 10 and FIG. 11 respectively depict diffraction-signature-based grouping for 1-D and 2-D patterns, according to example embodiments of the present invention.
Figure 11:
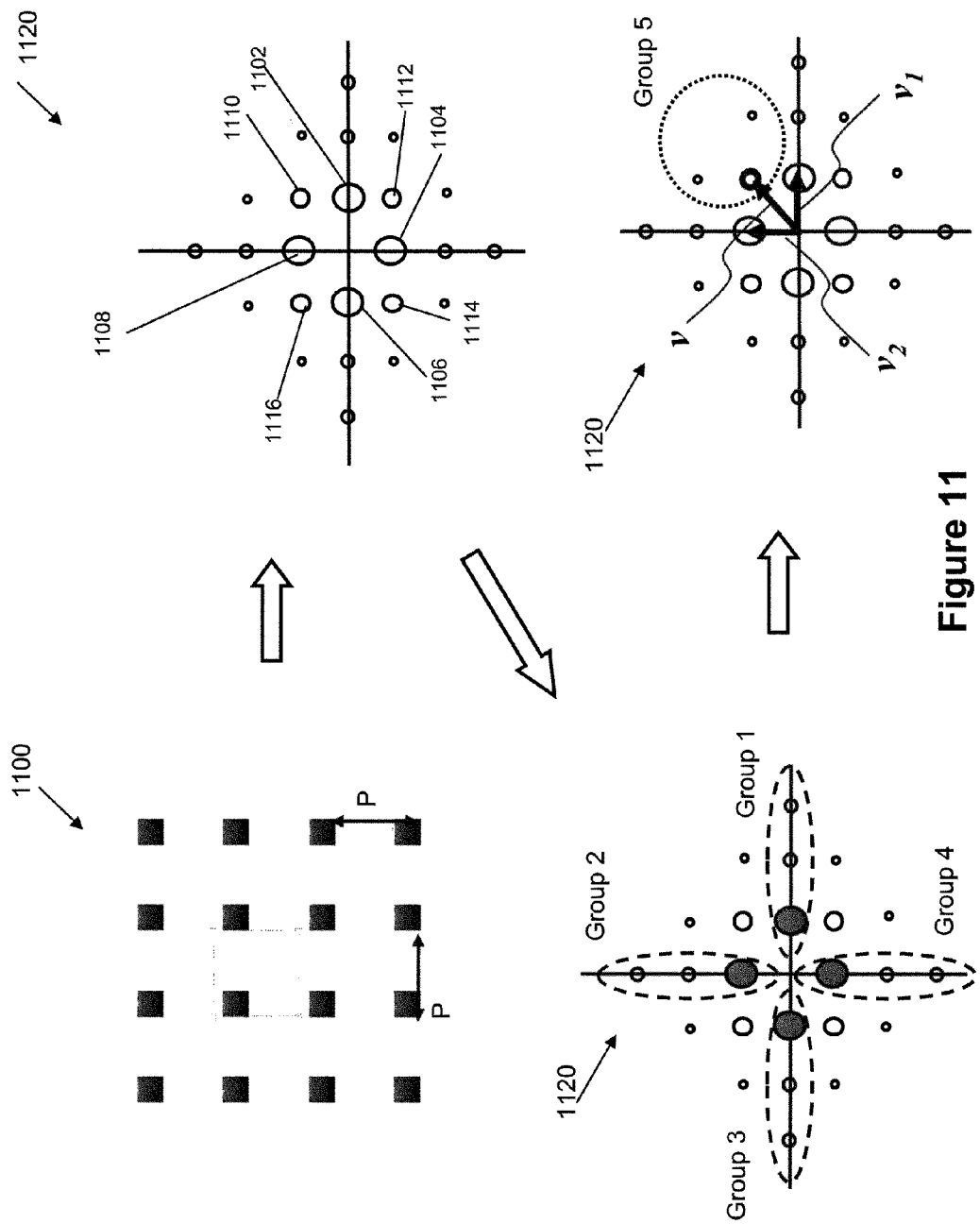

FIG. 10 and FIG. 11 respectively depict diffraction-signature-based grouping for 1-D and 2-D patterns, according to example embodiments of the present invention. It is noted that though the examples in FIGS. 9A-9B showed a single diffraction-signature group representing the entire respective clip, a plurality of diffraction-signature groups can exist even in a single clip. For example, in FIG. 10, a 1-D target pattern 1000 is shown, having two different pitches, P1 and P2, as shown. When a diffraction map is generated from the pattern 1000, and the diffraction peaks are plotted in frequency domain, the plot 1002 is resulted. Peaks 1006 and 1012 symmetrically positioned with respect to the centerline 1004 have the highest amplitudes. Peaks 1008 and 1014 symmetrically positioned with respect to the centerline 1004 have the next highest amplitudes. Peaks 1010 and 1016 symmetrically positioned with respect to the centerline 1004 have the lowest amplitudes. As shown in FIG. 10, Group B corresponds to denser pitch P1, with a basis vector 1020, and Group A, corresponds to the relatively loose pitch P2, with a basis vector of 1022. Peak 1006 (and 1012) has the highest amplitude, because at that location (i.e., at that frequency value), the $1^{st}$ order peak of Group B and the $2^{nd}$ order peak of Group A are superimposed.

In FIG. 11, a 2-D target pattern 1100 is shown, having identical pitch, P, in both x and y directions, as shown. Different pitches in both directions, and even multiple pitches in one direction can be accommodated too, as the scope of the invention is not restricted to any particular kind of target pattern. When a diffraction map is generated from the pattern 1100, and the diffraction peaks are plotted in frequency domain, the 2-D plot 1120 is resulted. 1102, 1104, 1106 and 1108 are the locations of the highest amplitude peaks. 1110, 1112, 1114 and 1116 are the locations of the next highest amplitude peaks. Diffraction-signature grouping starts with the highest amplitude peaks grouped into four groups, Group 1, Group 2, Group 3, and Group 4, as shown in the bottom left plot in FIG. 11 with dashed outlines. Neighboring lower amplitude peaks (except the next highest amplitude peaks) are included in the respective group that includes the closest highest amplitude peaks. As shown in the bottom right plot of FIG. 11, the basis vectors of the next highest amplitude peaks are the vector sum of the basis vectors of two neighboring highest-amplitude group basis vectors. All the peaks inside the dotted circle (Group 5), including the next highest amplitude peaks, have basis vectors that can be represented by, $v = n_x v_1 + n_y v_2$, where $n_x$ and $n_y$ are integers. The order of the peaks in the dotted circle is represented as $(n_x + n_y)$, so they are considered as higher order harmonics, rather than first order peaks. These peaks are grouped together.

Figures 12A, 12B:
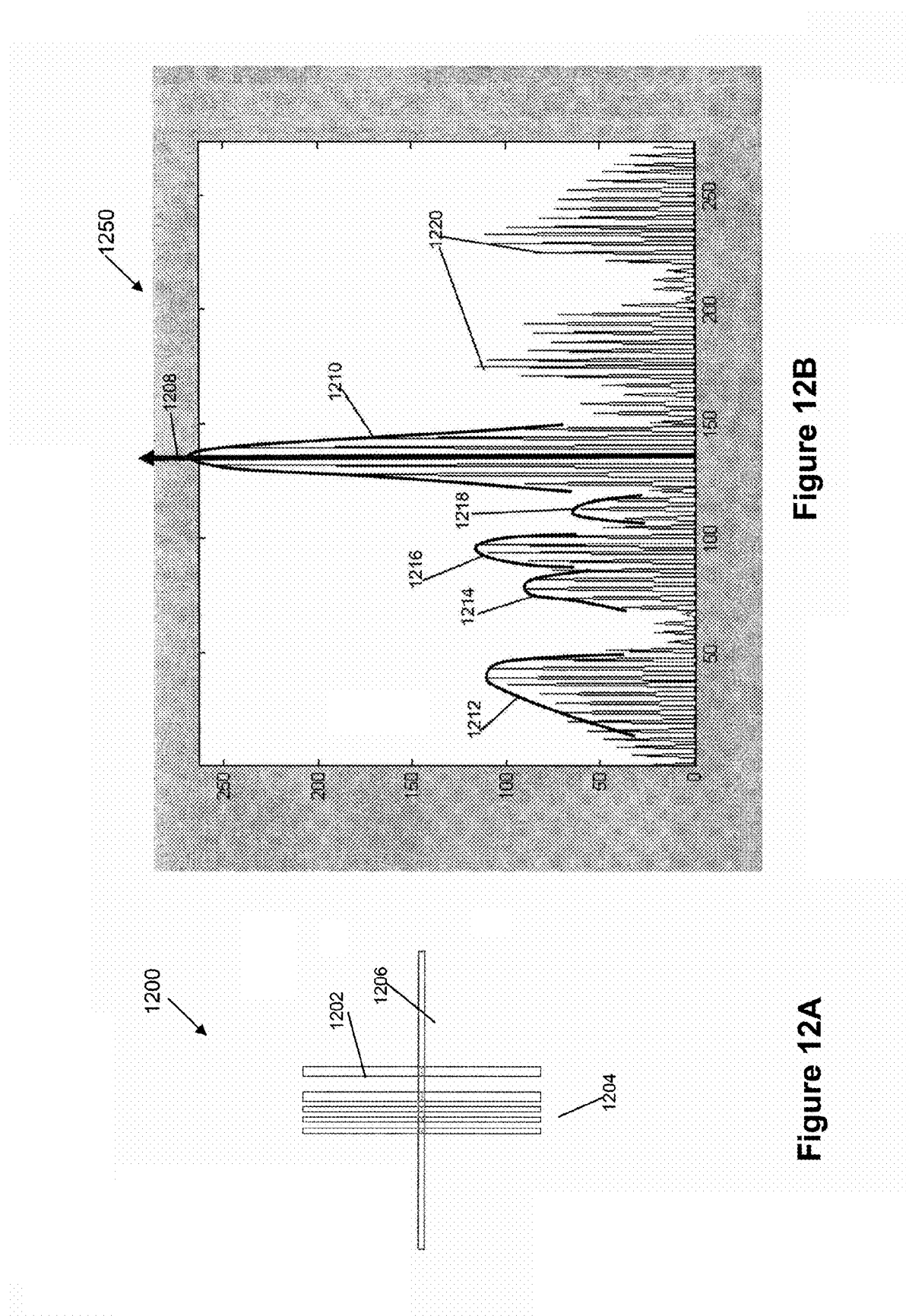
FIGS. 12A-C illustrate an example of a semi-isolated target pattern's diffraction-signature, according to an embodiment of the present invention.
Figure 12C:
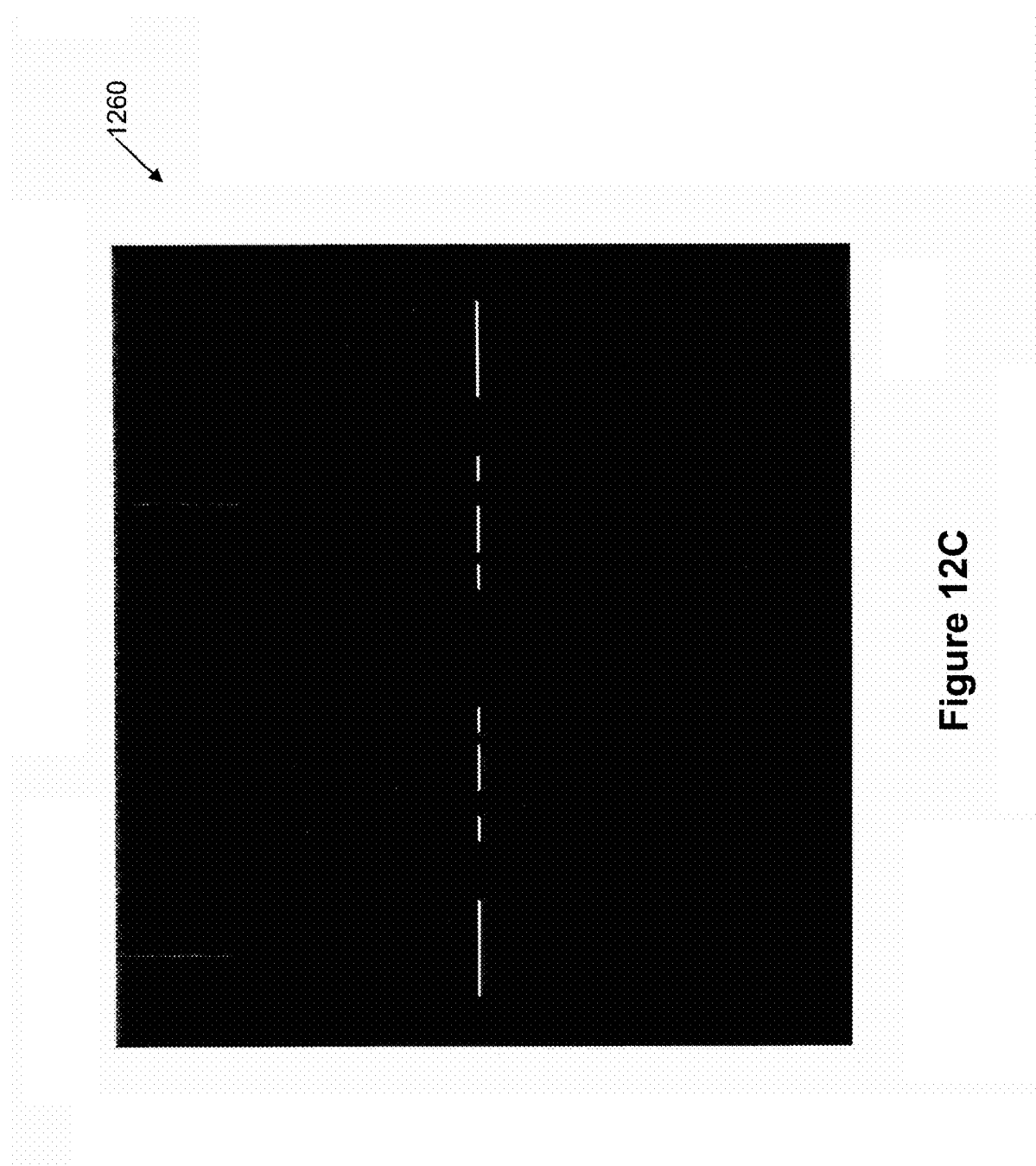

FIGS. 12A-C illustrate an example of a semi-isolated target pattern's diffraction-signature, according to an embodiment of the present invention. As shown in FIG. 12A, target pattern 1200 includes a semi-isolated feature 1202. A cutline 1206 is placed covering the densely spaced portion 1204 as well as the semi-isolated portion 1202 of the target pattern 1200. Diffraction plot 1250 is resulting from frequency-domain plotting of the diffraction map peaks. The notable feature here is the presence of continuous peaks rather than discrete peaks, as were shown in the previous examples. In other words, each continuous peak has a finite peak width, i.e. certain energy distribution around a center point. The x and y axes are normalized frequency and amplitude of the diffraction order peaks, in arbitrary units. The small peaks 1220 are artifacts of finite cell window size, and are not considered as separate diffraction peaks. Envelope 1210 denotes the zero-eth order continuous peak, and is discarded. Envelopes 1212, 1214, 1216 and 1218 denote higher-order (higher than zero) continuous peaks. Similar continuous peaks exist on the other side of the symmetry line 1208 too, though not specifically indicated in FIG. 12B. FIG. 12C shows the final grouping result 1260 obtained from the plot 1250, where the line segments denote continuous peaks generated by the semi-isolated target pattern 1200.

Figure 13C:
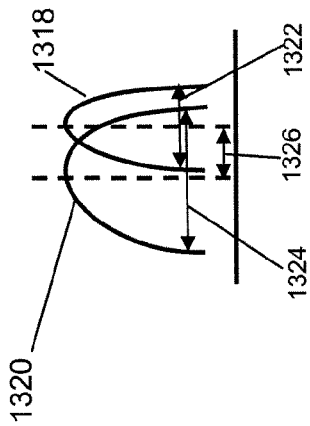
FIGS. 13A-C and 14 illustrate examples of coverage relationships for discrete and continuous peaks, according to embodiments of the present invention.
Figure 13B:
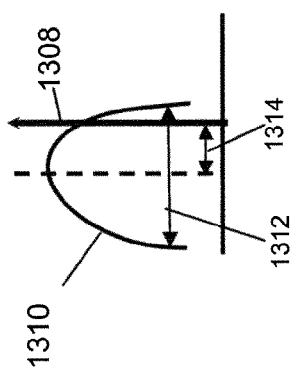
Figure 13A:
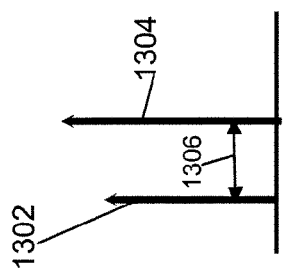

FIGS. 13A-C and 14 illustrate examples of coverage relationships for discrete and continuous peaks, according to embodiments of the present invention. As discussed before, a rule set is used to inspect the existing coverage relationships between the discrete and continuous peaks. For each peak, characteristic parameters, such as, location, width of peak (for continuous peaks), and amplitude of peak are stored. The rule set is applied on the stored peak data. A predefined tolerance value is included in the rule set. Peaks outside a threshold amplitude value range are discarded. Peaks outside a threshold radius range in the source pupil plane are not considered. Some of the rules included in the rule set are as follows:

- a peak 'v' is considered to overlap with another peak 'u' if the distance between 'v' and 'u' is less than an average width of peaks plus the predefined tolerance (see, for example, FIG. 13A, where a peak 1302 from group 1 and a peak 1304 from a group 2 have coverage relationship, as the distance 1306 is less than the tolerance value);
- a one-dimensional diffraction-signature group '$v_1$' is considered to be covered by another one-dimensional diffraction-signature group '$u_1$' if and only if there exists an integer 'n' such that '$v_1$' overlaps with '$n*u_1$';
- a two-dimensional diffraction-signature group ($v_1$, $v_2$) is considered to be covered by another two-dimensional diffraction-signature group ($u_1$, $u_2$), if and only if there exists a pair of integers ($n_1$, $n_2$) such that '$v_1$' overlaps with '$n_1*u_1+n_2*u_2$', and similarly, there exists a pair of integers ($m_1$, $m_2$) such that '$v_2$' overlaps with '$m_1*u_1+m_2*u_2$';
- a one-dimensional diffraction-signature group can not cover a two-dimensional diffraction-signature group;
- a discrete peak can cover a continuous peak (See, for example, FIG. 13B, where a continuous peak 1310 with width 1312 from a group 2 is covered by a discrete peak 1308 from a group 1 with a separation distance 1314 there between, if, (separation<width/2+tolerance);
- lower-order peaks cover higher-order peaks, but not vice versa. In other words, a group with a higher basis frequency covers a group with lower basis frequency.

FIG. 13C shows another example with two continuous peaks 1318 and 1320 belonging to two different groups. Peak width 1322 of continuous peak 1318 is width1, and peak width 1324 of continuous peak 1320 is width2. The separation between the centerlines of the peaks is 1326. The two peaks are said to overlap if, separation<[(width1+width2)/2+tolerance]. Two overlapping peaks are said to have a coverage relationship.

Figure 14:
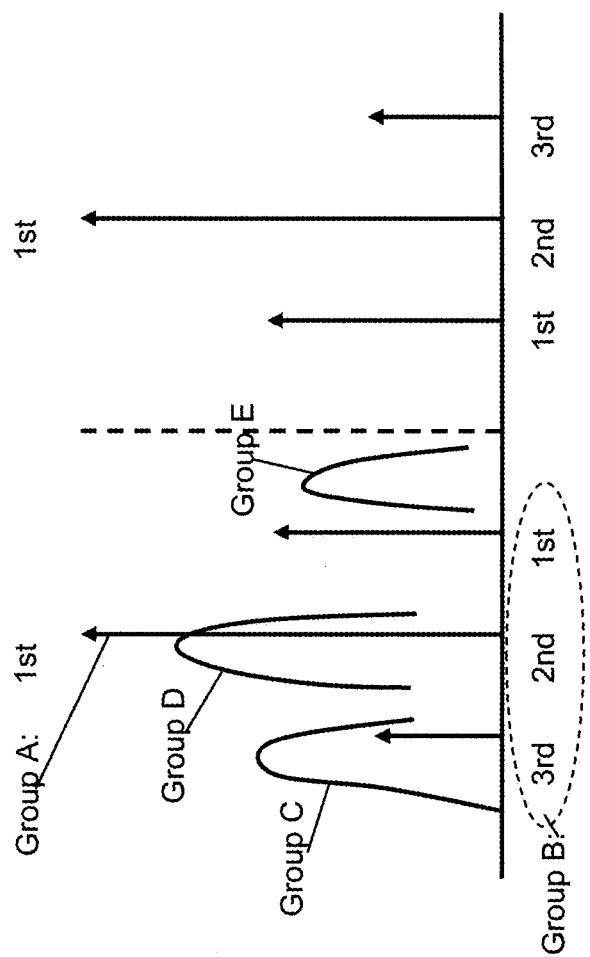

FIG. 14 shows an example of rule-based exploration of coverage relationship where both discrete and continuous peaks exist in the diffraction map. Here it is assumed that all continuous peaks are first order peaks. As shown in FIG. 14, group A is of the same order as group D. So Group D is covered by Group A, and only the clip with group A is selected. Group E does not overlap with any other group. So group E is not covered by any other group from any other clip. So group E (and the clip that contains group E) has to be selected. Group B has overlap with group C. Group C is of $1^{st}$ order. Group C overlaps with $3^{rd}$ order of group B. So, group B can not be covered by group C. But group B is covered by group A. Group C is isolated, and not covered by any group. So group C (and the clip containing group C) needs to be selected. The final result is, groups A, C, and E (and corresponding clips) are selected.

As a general rule, when there are degeneracy between different selection choices, pattern selection algorithm will find the option that provides the best coverage based on the difference between overlapping diffraction orders. When the distance is same, for example two patterns with the same pitches but different CDs, the clip with smaller clip index will be selected.

Figure 15:
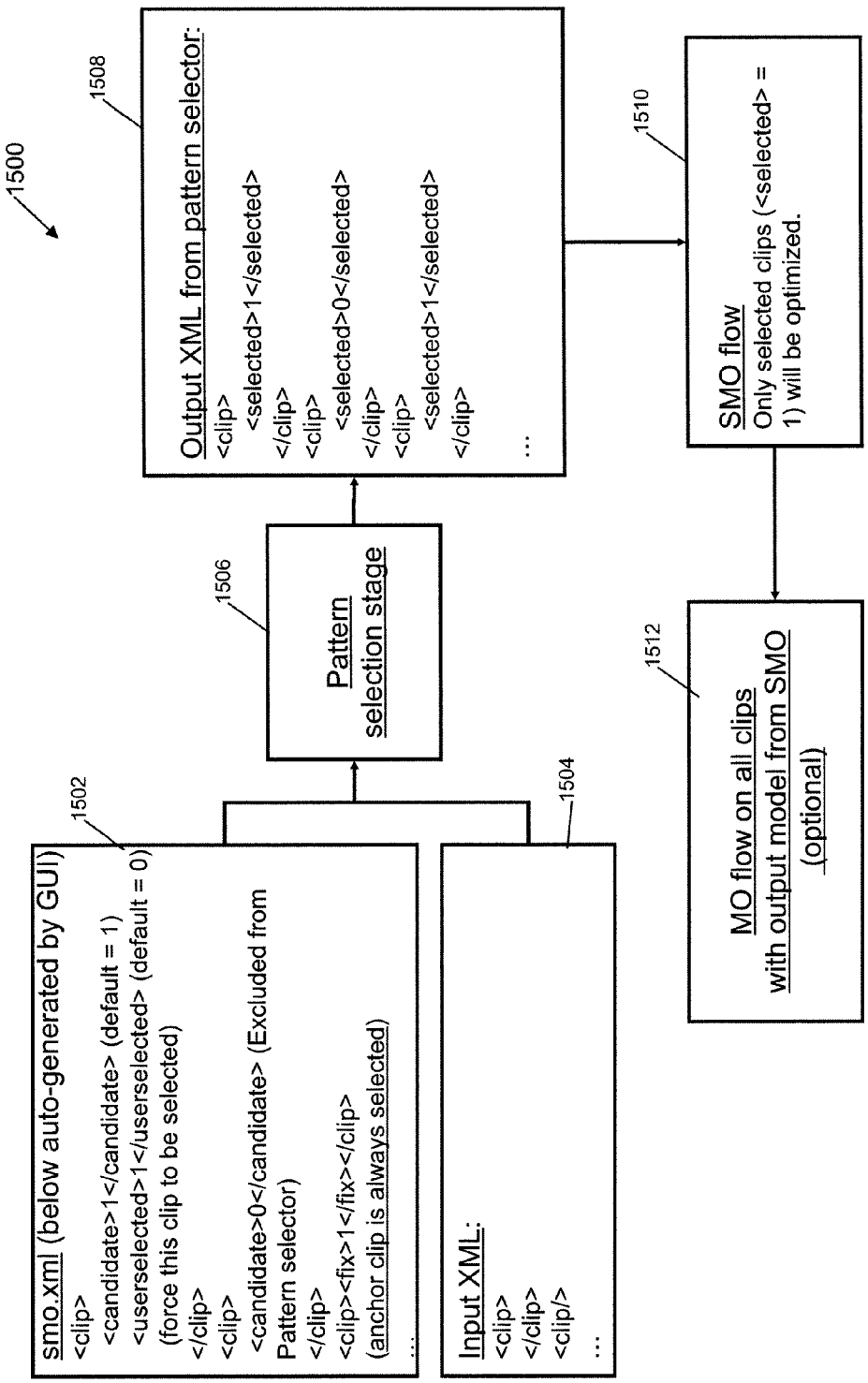
FIG. 15 shows an embodiment of the pattern selector module implemented as part of a SMO metrology process flow, according to an embodiment of the present invention.

The pattern selection algorithm discussed above can be implemented in a pattern selector module, which can be a part of a SMO process flow in a lithographic operation. FIG. 15 shows an embodiment 1500 of the pattern selector module implemented as a stage of a SMO metrology process flow, according to an embodiment of the present invention. In block 1502, an initial larger set of patterns (a candidate set) is selected. An anchor clip is always selected. In block 1504, user has the option of manually input more clips into the initial set. Then the pattern selection algorithm is run in block 1506. The output of the algorithm is obtained in block 1508. A subset of patterns is selected from the initial larger set. In block 1510, SMO is performed using the selected subset of patterns. In block 1512, optionally a mask-optimization algorithm is run on all or selected clips from the output of SMO.

Figures 16A, 16B:
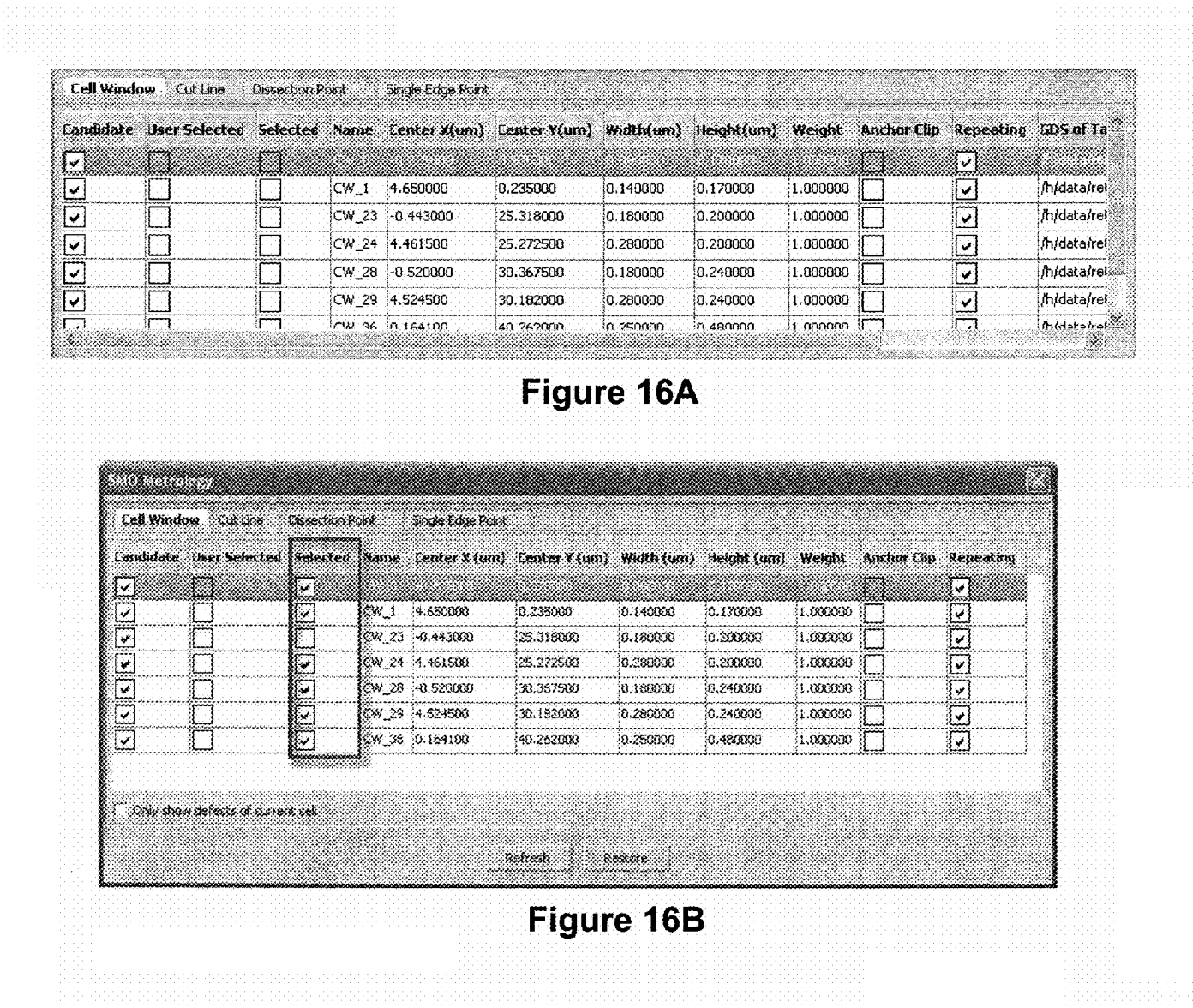

FIGS. 16A-16B show screenshots of user interfaces from the pattern selector module of FIG. 15. FIG. 16A shows the job setup interface before pattern selection algorithm is run (blocks 1502 and 1504, and FIG. 16B shows pattern review interface after pattern selection algorithm is run (block 1508). Selected clips are checked in subsequent SMO metrology window for block 1510.

Figure 17:
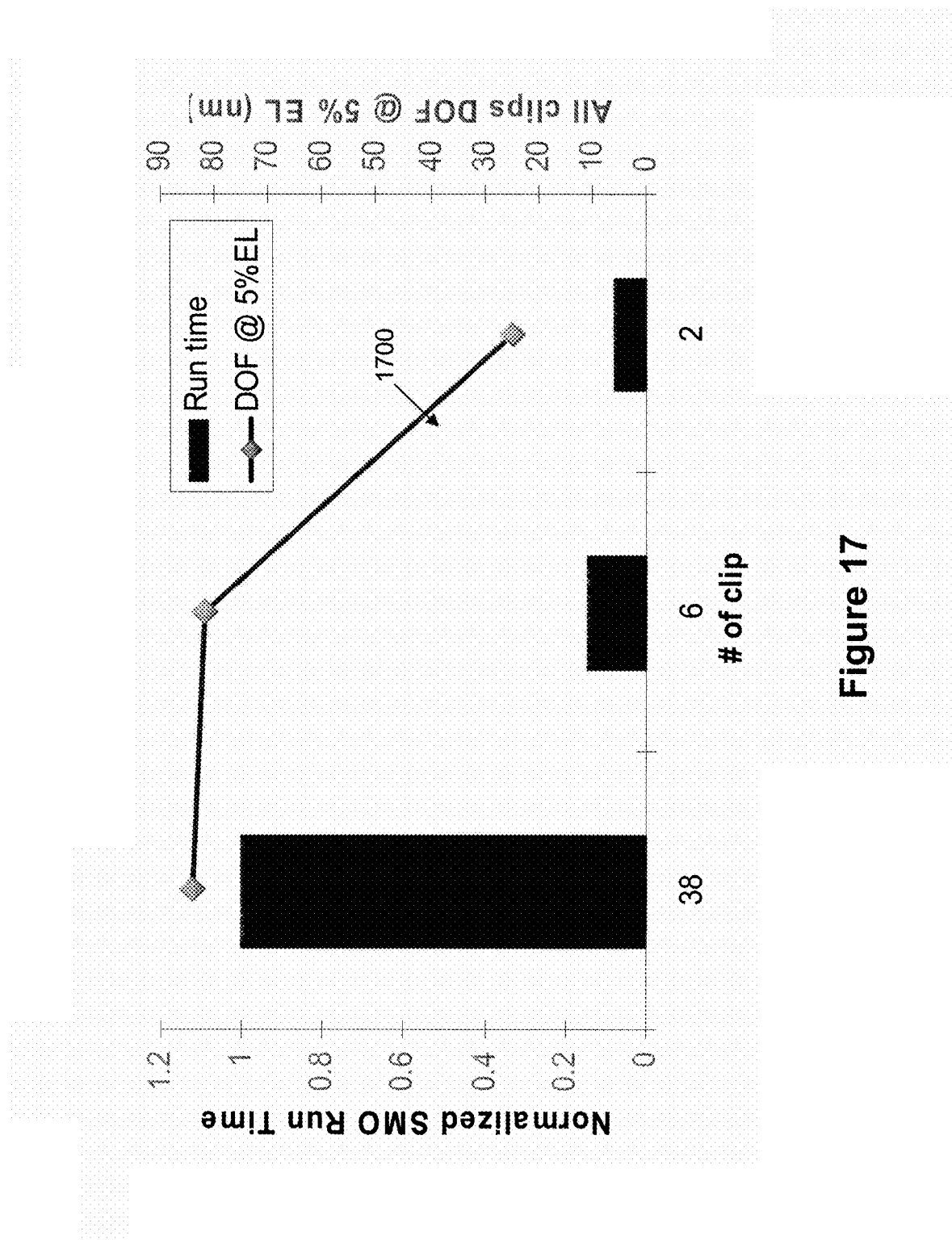
FIG. 17 illustrates improvement in SMO runtime and overall lithographic performance resulting from the pattern selection algorithm of the present invention.

FIG. 17 illustrates improvement in SMO runtime and overall lithographic performance resulting from the pattern selection algorithm of the present invention.

FIG. 17 shows a comparison of the lithographic performance for the pattern selection method described above (using 12 selected patterns automatically selected by the pattern selector module from a larger set of 50 clips), versus a conventional full-chip SMO method (using all 50 clips) and a baseline process of record (using 2 known clips). As can be seen, the pattern selection method replicates the original lithographic performance (i.e., without compromising process window) of a full-chip SMO method, as indicated by the depth of focus (DOF) graph 1700 at a fixed exposure latitude (EL) of 5%.

FIG. 17 also shows a chart comparing processing run time performance for the pattern selection methods described above, versus a conventional full-chip SMO method and a baseline process of record. As can be seen, pattern selection method reduces SMO run time significantly.

Figure 18:
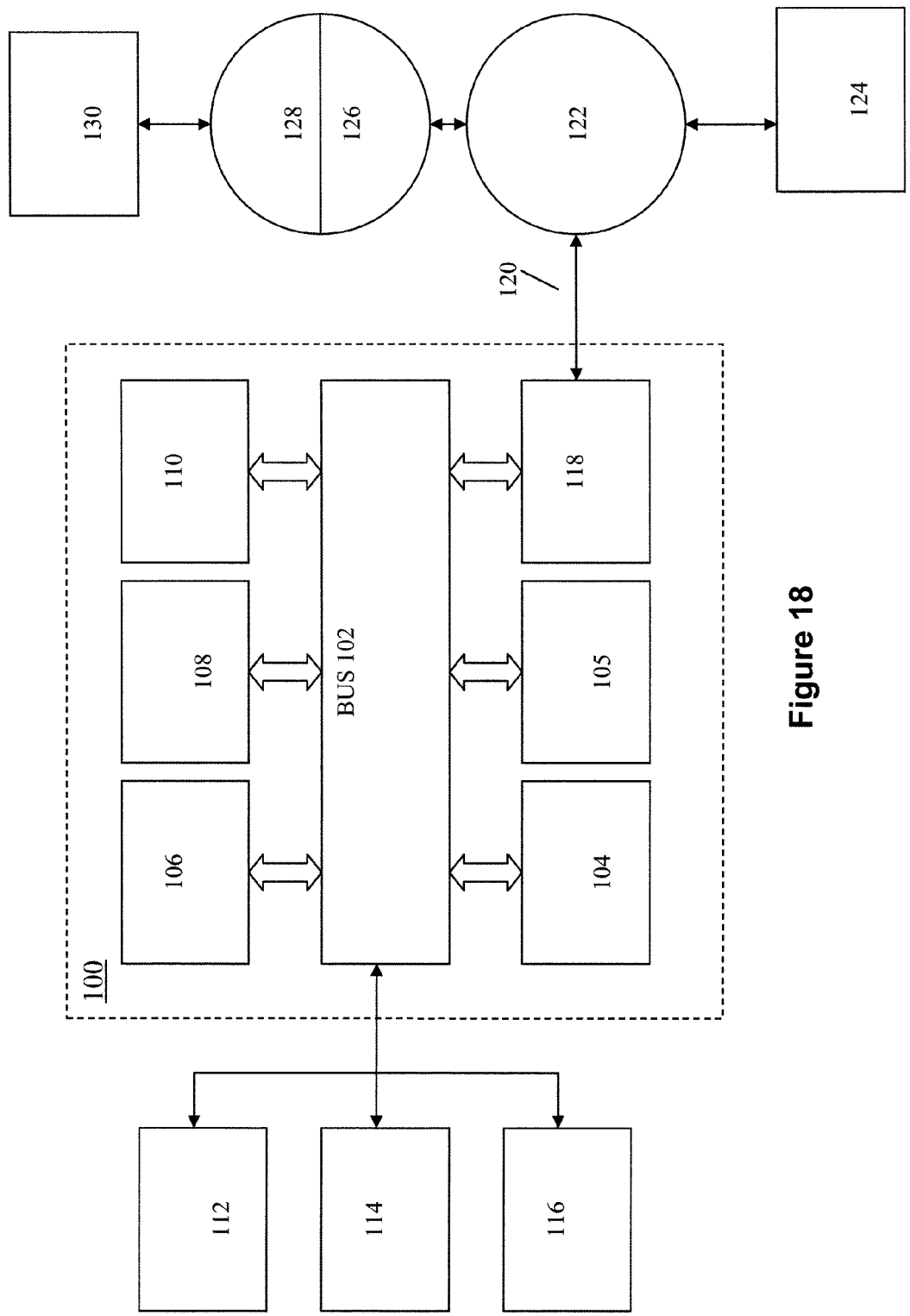
FIG. 18 is a block diagram that illustrates a computer system which can assist in the implementation of the simulation method of the present invention.

Details of a Computer System for Implementing the Embodiments of the Present Invention FIG. 18 is a block diagram that illustrates a computer system 100 which can assist in implementing the optimization methods and flows disclosed herein. Computer system 100 includes a bus 102 or other communication mechanism for communicating information, and a processor 104 coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment of the invention, portions of the optimization process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In alternative embodiments, hard-wired circuitry may be used in place of or in combination with software instructions to implement the invention. Thus, embodiments of the invention are not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 also preferably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. In accordance with the invention, one such downloaded application provides for the illumination optimization of the embodiment, for example. The received code may be executed by processor 104 as it is received, and/or stored in storage device 110, or other non-volatile storage for later execution. In this manner, computer system 100 may obtain application code in the form of a carrier wave.

Example Lithography Tool

Figure 19:
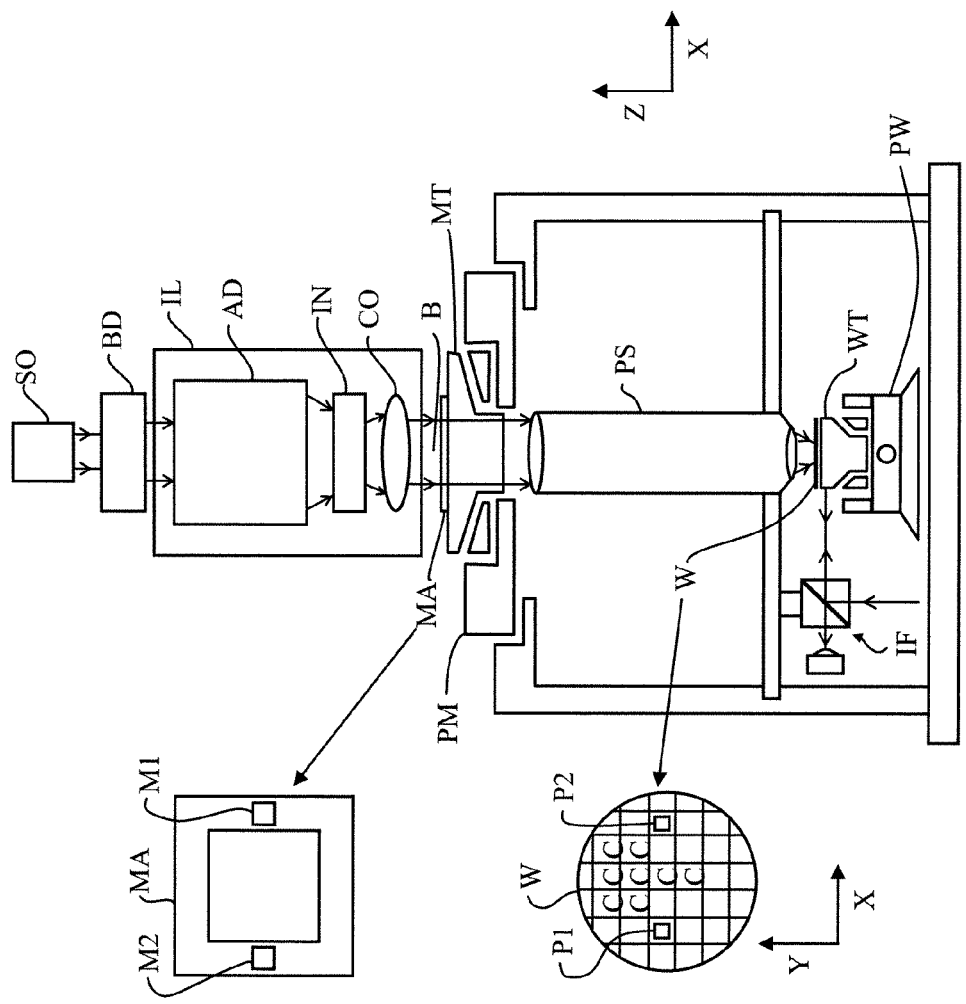
FIG. 19 schematically depicts a lithographic projection apparatus suitable for use with the method of the present invention.

FIG. 19 schematically depicts an exemplary lithographic projection apparatus whose illumination source could be optimized utilizing the processes of the present invention. The apparatus comprises:
  a radiation system Ex, IL, for supplying a projection beam PB of radiation. In this particular case, the radiation system also comprises a radiation source LA;
  a first object table (mask table) MT provided with a mask holder for holding a mask MA (e.g., a reticle), and connected to first positioning means for accurately positioning the mask with respect to item PL;
  a second object table (substrate table) WT provided with a substrate holder for holding a substrate W (e.g., a resist-coated silicon wafer), and connected to second positioning means for accurately positioning the substrate with respect to item PL;
  a projection system ("lens") PL (e.g., a refractive, catoptric or catadioptric optical system) for imaging an irradiated portion of the mask MA onto a target portion C (e.g., comprising one or more dies) of the substrate W.

As depicted herein, the apparatus is of a transmissive type (i.e., has a transmissive mask). However, in general, it may also be of a reflective type, for example (with a reflective mask). Alternatively, the apparatus may employ another kind of patterning means as an alternative to the use of a mask; examples include a programmable mirror array or LCD matrix.

The source LA (e.g., a mercury lamp or excimer laser) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 19 that the source LA may be within the housing of the lithographic projection apparatus (as is often the case when the source LA is a mercury lamp, for example), but that it may also be remote from the lithographic projection apparatus, the radiation beam that it produces being led into the apparatus (e.g., with the aid of suitable directing mirrors); this latter scenario is often the case when the source LA is an excimer laser (e.g., based on KrF, ArF or $F_2$ lasing). The current invention encompasses at least both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g., after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 19. However, in the case of a wafer stepper (as opposed to a step-and-scan tool) the mask table MT may just be connected to a short stroke actuator, or may be fixed.

The depicted tool can be used in two different modes:

In step mode, the mask table MT is kept essentially stationary, and an entire mask image is projected in one go (i.e., a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the mask table MT is movable in a given direction (the so-called "scan direction", e.g., the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

The concepts disclosed herein may simulate or mathematically model any generic imaging system for imaging sub wavelength features, and may be especially useful with emerging imaging technologies capable of producing wavelengths of an increasingly smaller size. Emerging technologies already in use include EUV (extreme ultra violet) lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range. Because most materials are absorptive within this range, illumination may be produced by reflective mirrors with a multi-stack of Molybdenum and Silicon. The multi-stack mirror has a 40 layer pairs of Molybdenum and Silicon where the thickness of each layer is a quarter wavelength. Even smaller wavelengths may be produced with X-ray lithography. Typically, a synchrotron is used to produce an X-ray wavelength. Since most material is absorptive at x-ray wavelengths, a thin piece of absorbing material defines where features would print (positive resist) or not print (negative resist).

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

The invention may further be described according to the following clauses:

1. A method of selecting a representative set of target patterns in a design layout configured to be imaged onto a substrate via a lithographic process, the method comprising the steps of:

generating a respective diffraction map for each of an initial larger set of target patterns in the design layout;

identifying peaks in each of the diffraction maps;

storing one or more characteristic parameters of the identified peaks in each of the diffraction maps;

analyzing the stored characteristic parameters of the identified peaks to create a list of diffraction-signature groups, each diffraction-signature group having one or more respective basis vectors;

inspecting coverage relationships existing between the various diffraction-signature groups from the various diffraction maps of the initial larger set of target patterns, wherein the coverage relationships are governed by pre-defined rules;

identifying a final subset of target patterns whose diffraction-signature groups adequately cover all possible diffraction-signature groups from all the diffraction maps; and selecting the final subset of target patterns to be included in the representative set of target patterns, such that the final subset of target patterns represents at least a part of the design layout for the lithographic process.

2. The method of clause 1, wherein the method further includes:

using the representative set of target patterns to optimize an illumination source used in the lithographic process.

3. The method of clause 2, wherein the method further comprises:

using the optimized illumination source for imaging the part of the design layout represented by the representative set of target patterns.

4. The method of clause 3, wherein the part of the design layout comprises the entire design layout, or a substantially large part of the entire design layout.

5. The method of clause 1, wherein the method further includes:

using the representative set of target patterns to optimize a projection optics system used in the lithographic process.

6. The method of clause 5, wherein the method further comprises:

using the optimized projection optics for imaging the part of the design layout represented by the representative set of target patterns.

7. The method of clause 6, wherein the part of the design layout comprises the entire design layout, or a substantially large part of the entire design layout.

8. The method of clause 1, wherein the representative set of target patterns includes one or more user-selected clips.

9. The method of clause 8, wherein at least one of the user-selected clips is an anchor clip for which no further mask optimization is recommended.

10. The method of clause 9, wherein the anchor clip comprises the densest line/space target pattern.

The descriptions above are intended to be illustrative, not limiting. Thus, it will be apparent to one skilled in the art that modifications may be made to the invention as described without departing from the scope of the claims set out below.

The invention claimed is:

1. A method implemented by a computer, the method being of selecting a subset of target patterns from a design layout configured to be imaged onto a substrate via a lithographic process, the method comprising the steps of:
   generating a respective diffraction map for a plurality of target patterns from an initial larger set of target patterns from the design layout;
   identifying diffraction signatures from the various diffraction maps of the plurality of target patterns from the initial larger set of target patterns;
   grouping the plurality of target patterns from the initial larger set of target patterns into diffraction-signature groups, the target patterns in a specific diffraction-signature group having similar diffraction signature; and
   selecting the subset being a representative set of target patterns to cover a predefined number of diffraction-signature groups, such that the representative set of target patterns represents at least a part of the design layout for the lithographic process,
   wherein one or more of the above steps are performed by the computer.

2. The method of claim 1, wherein the grouping of the plurality of target patterns is governed by predefined rules based on similarity of diffraction signature.

3. The method of claim 2, wherein the predefined rules comprise coverage relationships existing between the various diffraction-signature groups.

4. The method of claim 1, wherein the method further includes:
   using the representative set of target patterns to optimize an illumination source used in the lithographic process.

5. The method of claim 4, wherein optimizing the illumination source includes tuning polarization distribution of a radiation beam incident on a mask.

6. The method of claim 4, wherein the method further comprises:
   using the optimized illumination source for imaging the part of the design layout represented by the representative set of target patterns.

7. The method of claim 1, wherein the method further includes:
   using the representative set of target patterns to optimize a projection optics system used in the lithographic process.

8. The method of claim 7, wherein optimizing the projection optics system includes manipulating a wavefront of a radiation beam in a pupil plane after the radiation beam passes through the mask.

9. The method of claim 7, wherein the method further comprises:
   using the optimized projection optics for imaging the part of the design layout represented by the representative set of target patterns.

10. The method of claim 1, wherein the initial larger set of target patterns is either extracted from the design layout based on one or more predefined image optimization criteria, or, the initial larger set of target patterns is provided a priori based on one or more predefined image optimization criteria at certain known locations in the design layout.

11. The method of claim 10, wherein the one or more predefined image optimization criteria are based on one or more of the following:
   type of the target pattern;
   complexity of the target pattern;
   location of the target pattern;
   lithographic process window performance of the target pattern;
   known sensitivity of the target pattern to lithographic process parameter variations;
   a dimension of features in the target pattern;
   a pitch of the features in the target pattern;
   a degree of criticality of the target pattern in the design layout.

12. The method of claim 1, wherein the step of identifying diffraction signatures further comprises the steps of:
   identifying peaks in each of the diffraction maps;
   storing one or more characteristic parameters of the identified peaks in each of the diffraction maps; and
   analyzing the stored characteristic parameters of the identified peaks to create respective diffraction-signature groups for each of the diffraction maps.

13. The method of claim 12, wherein, each diffraction-signature group comprises one or more respective basis vectors.

14. The method of claim 13, wherein a one-dimensional basis vector represents a collinear peak, and two-dimensional basis vectors represent a pair of non-collinear peaks identified in the diffraction map.

15. The method of claim 12, wherein the characteristic parameters to be stored for the identified peaks include one or more of the following: location of the peak, width of the peak, amplitude of the peak, harmonic index of the peak, and, distance of the peak from one or more neighboring peaks.

16. The method of claim 1, wherein the diffraction-signature groups are either in spatial domain, or in frequency domain.

17. The method of claim 1, wherein generating the respective diffraction map comprises:
   generating a respective diffraction-order plot corresponding to the target pattern in each of the initial larger set of target patterns; and
   removing a zero-eth order peak from each of the diffraction-order plots.

18. The method of claim 17, wherein the step of analyzing the stored characteristic parameters of the identified peaks includes:
   identifying the strongest peak in the diffraction-order plot;
   constructing a respective one-dimensional basis vector for each collinear peak including the strongest peak in the diffraction-order plot;
   constructing respective two-dimensional basis vectors for each pair of non-collinear peaks in the diffraction-order plot;
   ignoring all harmonics present in the diffraction-order plot; and
   populating the list of diffraction-signature group by choosing the non-repetitive one dimensional and two-dimensional basis vectors.

19. The method of claim 18, wherein the predefined rules governing the coverage relationships include one or more of the following:

a peak 'v' is considered to overlap with another peak 'u' if the distance between 'v' and 'u' is less than an average width of peaks plus a predefined tolerance;

a one-dimensional diffraction-signature group '$v_1$' is considered to be covered by another one-dimensional diffraction-signature group if and only if there exists an integer 'n' such that '$v_1$' overlaps with '$n*u_1$';

a two-dimensional diffraction-signature group ($v_1$, $v_2$) is considered to be covered by another two-dimensional diffraction-signature group ($u_1$, $u_2$), if and only if there exists a pair of integers ($n_1$, $n_2$) such that '$v_1$' overlaps with '$n_1*u_1+n_2*u_2$', and similarly, there exists a pair of integers ($m_1$, $m_2$) such that '$v_2$' overlaps with '$m_1*u_1+m_2*u_2$';

a one-dimensional diffraction-signature group can not cover a two-dimensional diffraction-signature group;

a discrete peak can cover a continuous peak; and lower-order peaks cover higher-order peaks.

20. The method of claim 1, wherein the representative set of target patterns includes one or more user-selected clips.

21. A non-transitory computer program product comprising a computer-readable medium having instructions recorded therein, which when executed, cause the computer to perform the method of selecting the representative set of target patterns according to claim 1.

22. The method of claim 1, wherein the method of selecting the subset of target patterns from the design layout is independent of the lithographic process.

\* \* \* \* \*

UNITED STATES PATENT AND TRADEMARK OFFICE
CERTIFICATE OF CORRECTION

PATENT NO. : 8,543,947 B2  Page 1 of 1
APPLICATION NO. : 12/914954
DATED : September 24, 2013
INVENTOR(S) : Hua-Yu Liu et al.

It is certified that error appears in the above-identified patent and that said Letters Patent is hereby corrected as shown below:

On Title Page 2, Item (56) References Cited - Other Publications, Column 2, Line 7
replace "1, pp. 12-39 (Apr. 2002)."
with --1, pp. 13-30 (Apr. 2002).--.

Signed and Sealed this
Twenty-sixth Day of November, 2013

Margaret A. Focarino
*Commissioner for Patents of the United States Patent and Trademark Office*